United States Patent
Shimizu et al.

(10) Patent No.: US 9,761,552 B2
(45) Date of Patent: Sep. 12, 2017

(54) ELECTRONIC APPARATUS AND METHOD FOR FABRICATING THE SAME

(71) Applicant: FUJITSU LIMITED, Kawasaki-shi, Kanagawa (JP)

(72) Inventors: Kozo Shimizu, Atsugi (JP); Seiki Sakuyama, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/271,744

(22) Filed: Sep. 21, 2016

(65) Prior Publication Data
US 2017/0012013 A1 Jan. 12, 2017

Related U.S. Application Data

(63) Continuation of application No. 14/532,032, filed on Nov. 4, 2014, now Pat. No. 9,490,232.

(30) Foreign Application Priority Data
Dec. 9, 2013 (JP) .................................. 2013-254372

(51) Int. Cl.
*H01L 23/00* (2006.01)
*H01L 25/065* (2006.01)
(Continued)

(52) U.S. Cl.
CPC ............ *H01L 24/17* (2013.01); *B23K 1/0016* (2013.01); *B23K 3/085* (2013.01);
(Continued)

(58) Field of Classification Search
CPC ............ H01L 23/3128; H01L 23/3675; H01L 23/488; H01L 23/49816; H01L 23/49827;
(Continued)

(56) References Cited

U.S. PATENT DOCUMENTS

| 6,184,061 B1 | 2/2001 | Wu et al. |
| 2002/0056906 A1* | 5/2002 | Kajiwara et al. ..... H01L 21/563 257/697 |

(Continued)

FOREIGN PATENT DOCUMENTS

| JP | 11-307565 | 11/1999 |
| JP | 2001-351946 | 12/2001 |

(Continued)

OTHER PUBLICATIONS

USPTO, (Rodriguez) Notice of Allowance and Notice of Allowability. Aug. 19, 2016, in parent U.S. Appl. No. 14/532,032 [allowed].
(Continued)

*Primary Examiner* — Armando Rodriguez
(74) *Attorney, Agent, or Firm* — Fujitsu Patent Center

(57) ABSTRACT

An electronic apparatus includes a first electronic part with a first terminal, a second electronic part with a second terminal opposite the first terminal, and a joining portion which joins the first terminal and the second terminal. The joining portion contains a pole-like compound extending in a direction in which the first terminal and the second terminal are opposite to each other. The joining portion contains the pole-like compound, so the strength of the joining portion is improved. When the first terminal and the second terminal are joined, the temperature of one of the first electronic part and the second electronic part is made higher than that of the other. A joining material is cooled and solidified in this state. By doing so, the pole-like compound is formed.

6 Claims, 18 Drawing Sheets

(51) Int. Cl.
*H01L 23/367* (2006.01)
*H01L 25/00* (2006.01)
*B23K 1/00* (2006.01)
*B23K 3/08* (2006.01)
*H01L 23/31* (2006.01)
*H01L 23/488* (2006.01)
*H01L 23/498* (2006.01)
*B23K 35/02* (2006.01)
*B23K 35/26* (2006.01)
*H05K 1/02* (2006.01)
*H05K 3/34* (2006.01)
*H01L 23/14* (2006.01)
*B23K 101/40* (2006.01)
*B23K 101/42* (2006.01)
*H05K 1/09* (2006.01)
*H05K 1/11* (2006.01)

(52) U.S. Cl.
CPC ........ *B23K 35/0244* (2013.01); *B23K 35/262* (2013.01); *B23K 35/264* (2013.01); *H01L 23/3128* (2013.01); *H01L 23/3675* (2013.01); *H01L 23/488* (2013.01); *H01L 23/49816* (2013.01); *H01L 23/49822* (2013.01); *H01L 23/49827* (2013.01); *H01L 24/13* (2013.01); *H01L 24/16* (2013.01); *H01L 24/19* (2013.01); *H01L 24/75* (2013.01); *H01L 24/81* (2013.01); *H01L 25/0655* (2013.01); *H01L 25/0657* (2013.01); *H01L 25/50* (2013.01); *H05K 3/3463* (2013.01); *B23K 2001/12* (2013.01); *B23K 2201/40* (2013.01); *B23K 2201/42* (2013.01); *H01L 23/145* (2013.01); *H01L 23/3114* (2013.01); *H01L 23/49838* (2013.01); *H01L 24/20* (2013.01); *H01L 24/73* (2013.01); *H01L 2224/0401* (2013.01); *H01L 2224/04105* (2013.01); *H01L 2224/05082* (2013.01); *H01L 2224/05144* (2013.01); *H01L 2224/05147* (2013.01); *H01L 2224/05155* (2013.01); *H01L 2224/05567* (2013.01); *H01L 2224/05624* (2013.01); *H01L 2224/05647* (2013.01); *H01L 2224/1146* (2013.01); *H01L 2224/11334* (2013.01); *H01L 2224/131* (2013.01); *H01L 2224/13016* (2013.01); *H01L 2224/13076* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/1601* (2013.01); *H01L 2224/16145* (2013.01); *H01L 2224/16157* (2013.01); *H01L 2224/16235* (2013.01); *H01L 2224/16238* (2013.01); *H01L 2224/16505* (2013.01); *H01L 2224/16507* (2013.01); *H01L 2224/24137* (2013.01); *H01L 2224/24195* (2013.01); *H01L 2224/293* (2013.01); *H01L 2224/2919* (2013.01); *H01L 2224/2929* (2013.01); *H01L 2224/32225* (2013.01); *H01L 2224/33181* (2013.01); *H01L 2224/48091* (2013.01); *H01L 2224/48106* (2013.01); *H01L 2224/48227* (2013.01); *H01L 2224/73204* (2013.01); *H01L 2224/73253* (2013.01); *H01L 2224/73265* (2013.01); *H01L 2224/759* (2013.01); *H01L 2224/75253* (2013.01); *H01L 2224/75501* (2013.01); *H01L 2224/75502* (2013.01); *H01L 2224/81005* (2013.01); *H01L 2224/8121* (2013.01); *H01L 2224/81075* (2013.01); *H01L 2224/81191* (2013.01); *H01L 2224/81192* (2013.01); *H01L 2224/81411* (2013.01); *H01L 2224/81815* (2013.01); *H01L 2224/81948* (2013.01); *H01L 2224/81986* (2013.01); *H01L 2225/06513* (2013.01); *H01L 2924/014* (2013.01); *H01L 2924/10252* (2013.01); *H01L 2924/10253* (2013.01); *H01L 2924/10271* (2013.01); *H01L 2924/10329* (2013.01); *H01L 2924/10335* (2013.01); *H01L 2924/13091* (2013.01); *H01L 2924/1579* (2013.01); *H01L 2924/15311* (2013.01); *H01L 2924/15313* (2013.01); *H01L 2924/1659* (2013.01); *H01L 2924/16235* (2013.01); *H01L 2924/16251* (2013.01); *H01L 2924/16747* (2013.01); *H01L 2924/181* (2013.01); *H01L 2924/19041* (2013.01); *H01L 2924/19105* (2013.01); *H01L 2924/3512* (2013.01); *H01L 2924/35121* (2013.01); *H05K 1/0203* (2013.01); *H05K 1/09* (2013.01); *H05K 1/113* (2013.01); *H05K 3/3436* (2013.01); *H05K 2201/0248* (2013.01); *H05K 2201/09972* (2013.01); *H05K 2201/1056* (2013.01); *H05K 2203/1121* (2013.01); *H05K 2203/304* (2013.01)

(58) Field of Classification Search
CPC ........ H01L 24/16; H01L 24/19; H01L 24/13; H01L 24/75; H01L 24/81; H01L 25/0657; H01L 25/50; B23K 1/0016; B23K 3/085; B23K 35/0244; B23K 35/262; B23K 35/264
See application file for complete search history.

(56) References Cited

U.S. PATENT DOCUMENTS

| | | |
|---|---|---|
| 2002/0093096 A1 | 7/2002 | Tago et al. |
| 2004/0197979 A1 | 10/2004 | Jeong et al. |
| 2007/0084904 A1 | 4/2007 | Sumikawa et al. |
| 2009/0085216 A1* | 4/2009 | Tanaka et al. ....... B23K 35/025 257/772 |
| 2012/0168206 A1 | 7/2012 | Sekine et al. |
| 2013/0083488 A1 | 4/2013 | Watanabe et al. |
| 2014/0332259 A1 | 11/2014 | Tsuchida et al. |

FOREIGN PATENT DOCUMENTS

| | | |
|---|---|---|
| JP | 2001-358458 | 12/2001 |
| JP | 2002-076606 | 3/2002 |
| JP | 2002-239780 | 8/2002 |
| JP | 2002-280417 | 9/2002 |
| JP | 2004-349487 | 12/2004 |
| JP | 2005-101614 | 4/2005 |
| JP | 2005-517535 | 6/2005 |
| JP | 2007-242783 | 9/2007 |
| WO | 03/070994 | 8/2003 |

OTHER PUBLICATIONS

USPTO, (Rodriguez) Final Rejection, Jun. 7, 2016, in parent U.S. Appl. No. 14/532,032 [allowed].
USPTO, (Rodriguez) Non-Final Rejection, Jan. 29, 2016, in parent U.S. Appl. No. 14/532,032 [allowed].
USPTO, (Rodriguez) Final Rejection, Sep. 30, 2015. in parent U.S. Appl. No. 14/532,032 [allowed].
USPTO, (Rodriguez) Non-Final Rejection/Restriction Requirement, Jun. 4, 2015, in parent U.S. Appl. No. 14/532,032 [allowed].
USPTO, (Rodriguez) Non-Final Rejection, Sep. 8, 2016, in copending U.S. Appl. No. 15/142,690 [pending].
USPTO, (Rodriguez) Notice of Allowance mailed on Oct. 20, 2016 and Supplemental Notice of Allowability mailed on Nov. 2, 2016 issued in copending U.S. Appl. No. 15/142,690 [allowed].

(56) References Cited

OTHER PUBLICATIONS

\*\*Please note that the USOAs cited herewith were made of record in the related U.S. Appl. No. 15/142,690. Thus, the references are not being submitted herewith.
CNOA—Chinese Office Action issued on Dec. 30, 2016 for corresponding Chinese Application No. 201410708719.0, with English translation.
USPTO, Non-Final Rejection dated Mar. 20, 2017 in related U.S. Appl. No. 15/351,992 [pending].
JPOA—Japanese Office Action dated May 30, 2017 for Japanese Patent Application No. 2013-254372, with machine translation.
USPTO, Notice of Allowance dated Jul. 21, 2017 for related U.S. Appl. No. 15/351,992 [allowed].

\* cited by examiner

ELECTRONIC APPARATUS AND METHOD FOR FABRICATING THE SAME

CROSS-REFERENCE TO RELATED APPLICATION

This application is a division of application Ser. No. 14/532,032, filed Nov. 4, 2014, which is based upon and claims the benefit of priority of the prior Japanese Patent Application No. 2013-254372, filed on Dec. 9, 2013, the entire contents of which are incorporated herein by reference.

FIELD

The embodiments discussed herein are related to an electronic apparatus and an electronic apparatus fabrication method.

BACKGROUND

The technique of electrically connecting terminals of electronic parts by joining them by the use of a joining material is known. For example, solder which contains one or more kinds of components is used as a joining material. For example, the technique of mounting a semiconductor element or a semiconductor package over a board, such as a printed board, by the use of solder bumps is known.

Japanese Laid-open Patent Publication No. 2002-239780
Japanese Laid-open Patent Publication No. 2007-242783

A joining failure, such as a crack, peel, or disconnection, may occur in a joining portion between terminals of electronic parts due to impact from the outside or a thermal stress created by heat generated by the electronic parts or heat applied to the electronic parts.

SUMMARY

According to an aspect, there is provided an electronic apparatus including a first electronic part with a first terminal, a second electronic part with a second terminal opposite the first terminal, and a joining portion which joins the first terminal and the second terminal and which contains a first pole-like compound extending in a direction in which the first terminal and the second terminal are opposite to each other.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

A first embodiment will be described first.

Figure 1:
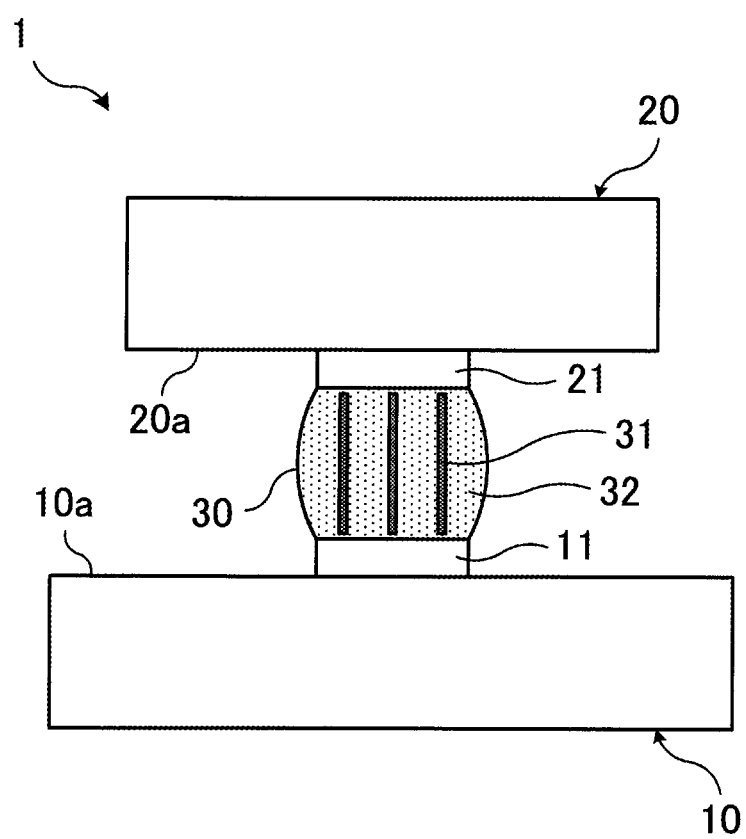
FIG. 1 illustrates an example of an electronic apparatus according to a first embodiment.

FIG. 1 illustrates an example of an electronic apparatus according to a first embodiment. FIG. 1 is a fragmentary schematic sectional view of an example of an electronic apparatus according to a first embodiment.

An electronic apparatus 1 illustrated in FIG. 1 includes an electronic part 10, an electronic part 20, and a joining portion 30 which joins the electronic part 10 and the electronic part 20.

The electronic part 10 has a terminal 11 formed over a surface 10a. In the example of FIG. 1, one terminal 11 is illustrated.

The electronic part 20 is disposed opposite the electronic part 10. The electronic part 20 has a terminal 21 formed over a surface 20a opposite the surface 10a of the electronic part 10. In the example of FIG. 1, one terminal 21 is illustrated. The terminal 21 of the electronic part 20 is formed at a position corresponding to the terminal 11 of the electronic part 10.

The joining portion 30 is formed between the terminal 11 of the electronic part 10 and the terminal 21 of the electronic part 20 and joins the terminal 11 and the terminal 21.

A semiconductor element (semiconductor chip), a semiconductor package including a semiconductor element, a circuit board, or the like is used as each of the electronic part 10 and the electronic part 20. The details of the structure of each of the electronic part 10 and the electronic part 20 will be described later.

Solder is used for forming the joining portion 30 which joins the electronic part 10 and the electronic part 20. Solder which contains tin (Sn) is used. For example, Pb-free solder which does not contain lead (Pb) is used. For example, Sn—Ag based solder which contains Sn and silver (Ag) is used for forming the joining portion 30. For example, Sn—Ag based solder which contains 0.5 wt % or more of Ag is used.

In the electronic apparatus 1, the joining portion 30 contains a pole-like compound 31 which extends in a direction in which the terminal 11 of the electronic part 10 and the terminal 21 of the electronic part 20 are opposite to each other (in a direction from a terminal 11 side to a terminal 21 side or in a direction from the terminal 21 side to the terminal 11 side). For example, if the above Sn—Ag based solder is used for forming the joining portion 30, then the joining portion 30 contains the pole-like compound 31 which is $Ag_3Sn$ (IMC (InterMetallic Compound)).

The pole-like compound 31 is formed in the process of joining the electronic part 10 and the electronic part 20 by the use of a material (joining material) of which the joining portion 30 is formed.

Figure 2A:
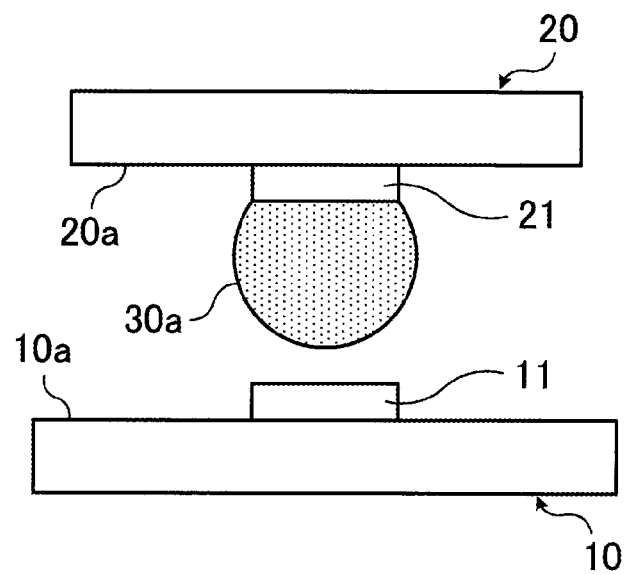
FIGS. 2A, 2B, and 2C illustrate an example of an electronic part joining process according to the first embodiment.
Figure 2B:
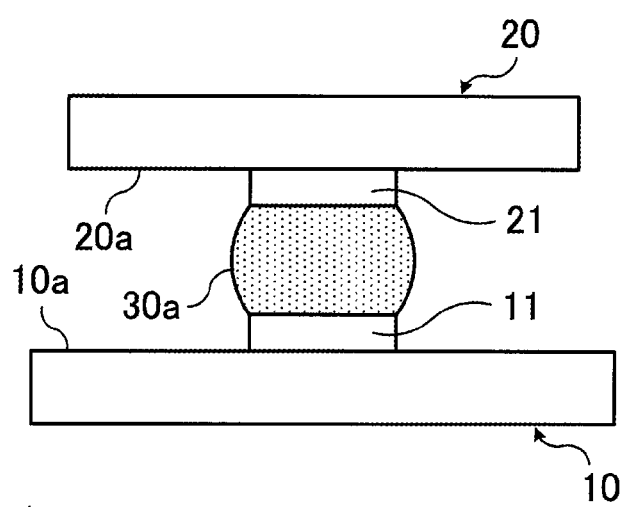
Figure 2C:
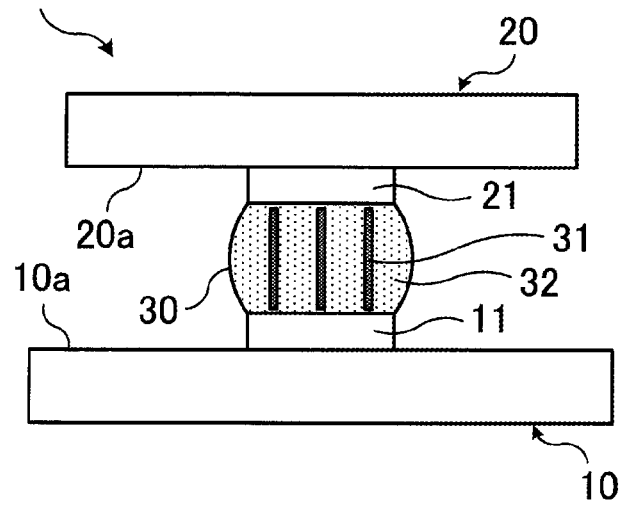

FIGS. 2A, 2B, and 2C illustrate an example of an electronic part joining process according to the first embodiment. Each of FIGS. 2A, 2B, and 2C is a fragmentary schematic sectional view of an example of an electronic part joining process according to the first embodiment. FIG. 2A illustrates an example of a state before joining. FIG. 2B illustrates an example of a state at joining time. FIG. 2C illustrates an example of a state after joining.

First the electronic part 10 and the electronic part 20 to be joined together illustrated in FIG. 2A are prepared. A joining material 30a is put in advance on a terminal of one of the electronic part 10 and the electronic part 20 prepared. In the example of FIG. 2A, the joining material 30a is put in advance on the terminal 21 of the electronic part 20. The joining material 30a is used for forming the above joining portion 30. For example, solder is used as the joining material 30a. Description will be given with a case where Sn—Ag based solder is used as the joining material 30a as an example.

The joining material 30a on the terminal 21 of the electronic part 20 illustrated in FIG. 2A is formed, for example, in the following way. Solder put on the terminal 21 by mounting a solder ball on the terminal 21 or depositing solder on the terminal 21 by plating is melted by heating and is solidified by cooling. In the example of FIG. 2A, the joining material 30a is formed so as to have a shape close to a ball. However, there is no limit to the shape of the joining material 30a and the joining material 30a may take various shapes.

After the above electronic part 10 and the above electronic part 20 on which the joining material 30a is put are prepared, the terminal 11 of the electronic part 10 is aligned with the terminal 21 (joining material 30a) of the electronic part 20, as illustrated in FIG. 2A, to dispose them opposite each other.

As illustrated in FIG. 2B, the joining material 30a on the terminal 21 of the electronic part 20 is then melted by heating and is connected to the terminal 11 of the electronic part 10. After the joining material 30a is connected to the terminal 11, the joining material 30a is solidified by cooling. In this case, the joining material 30a is heated in a furnace in an atmosphere of an inert gas such as nitrogen ($N_2$). The joining material 30a is cooled in a furnace in an atmosphere of an inert gas. For example, the joining material 30a is cooled by purging the inside of a furnace or the joining material 30a is allowed to cool in a furnace.

In the process of cooling the joining material 30a after heating, an adjustment is made so as to make the temperature of one of the electronic part 10 and the electronic part 20 higher than that of the other, for example, during at least a period from the beginning to the end of the solidification of the joining material 30a. For example, an adjustment is made so as to make the temperature of the electronic part 20 higher than that of the electronic part 10. Alternatively, an adjustment is made so as to make the temperature of the electronic part 10 higher than that of the electronic part 20.

For example, a member having determined heat capacity is disposed over one of the electronic part 10 and the electronic part 20 to lower the rate at which the one over which the member is disposed is cooled. This makes the temperature of the one electronic part higher than that of the other electronic part, for example, during a period from the beginning to the end of the solidification of the joining material 30a.

Another method may be used. One electronic part is selectively heated to lower the rate at which the one electronic part is cooled. Alternatively, the other electronic part is selectively cooled to raise the rate at which the other electronic part is cooled. This makes the temperature of the one electronic part higher than that of the other electronic part, for example, during a period from the beginning to the end of the solidification of the joining material 30a.

As has been described, the temperature of one electronic part is made higher than that of the other electronic part, for example, during a period from the beginning to the end of the solidification of the joining material 30a in the process of cooling the joining material 30a after heating. By doing so, a temperature gradient is produced in the joining material 30a at solidification time. That is to say, the following temperature gradient is produced. The temperature of the joining material 30a on the one electronic part side on which the temperature is made high is higher than that of the joining material 30a on the other electronic part side. Such a temperature gradient is produced, so the solidification of the joining material 30a usually progresses from the other electronic part side at lower temperatures to the one electronic part side at higher temperatures.

The solidification progresses in this way. Accordingly, as illustrated in FIG. 2C, the pole-like compound 31, which is $Ag_3Sn$, is formed in the joining material 30a, which is Sn—Ag based solder, so that it will extend in the direction in which the solidification progresses, that is to say, in the direction in which the terminal 11 of the electronic part 10 and the terminal 21 of the electronic part 20 are opposite to each other. In the example of FIG. 2C, a plurality of pole-like compounds 31 are illustrated. The pole-like compounds 31, which are $Ag_3Sn$, are covered with a portion 32 which contains Sn and Ag contained in the joining material 30a. With the progress of the solidification, the joining portion 30 which contains the pole-like compounds 31 is formed inside the portion 32. As a result, as illustrated in FIG. 2C, the electronic apparatus 1 in which the electronic part 10 and the electronic part 20 are joined by the joining portion 30 is obtained.

The pole-like compounds 31 extending in this way in the direction in which the terminal 11 of the electronic part 10 and the terminal 21 of the electronic part 20 are opposite to each other are formed in the joining portion 30. The pole-like compounds 31 function like metal reinforcements, so the strength of the joining portion 30 against external force or stress created by heat improves. For example, the strength of the joining portion 30 against stress created in a direction which intersects the direction in which the pole-like compounds 31 extend improves.

For example, with an increase in the density of semiconductor elements mounted or a decrease in the pitch between terminals, the size of semiconductor elements or semiconductor packages increases or solder joining portions between semiconductor elements or semiconductor packages and circuit boards become minuter. As a result, larger external force or stress may be applied to joining portions. If the above Sn—Ag based solder is used for forming a joining portion and the above joining method described in FIGS. 2A through 2C is not used, then a coarse $Ag_3Sn$ compound may be formed in the joining portion or a pole-like $Ag_3Sn$ compound formed in the joining portion may extend in the direction of a terminal surface. If external force or stress created by heat is concentrated on such a compound, a crack, peel, or shear peel due to shear stress tends to appear in the joining portion with a portion of the compound as a starting point.

As stated above, the pole-like compounds 31 extending in the direction in which the terminal 11 of the electronic part 10 and the terminal 21 of the electronic part 20 are opposite to each other are formed in the joining portion 30 between the electronic part 10 and the electronic part 20. By doing so, the strength of the joining portion 30 against external force or stress created by heat improves. Such improvement in the strength of the joining portion 30 effectively controls the appearance of a crack or peel in the joining portion 30 caused by external force or stress or a disconnection caused by such a crack or peel.

There is no need for the formed pole-like compounds 31 to reach from the terminal 11 of the electronic part 10 to the terminal 21 of the electronic part 20. Even if the pole-like compounds 31 are short and do not reach from the terminal 11 to the terminal 21, the presence of the pole-like compounds 31 in the joining portion 30 leads to the above improvement in the strength of the joining portion 30 and the appearance of a crack or peel is controlled. For example, the length of the above pole-like compounds 31 formed may be half or more of the distance between the terminal 11 and the terminal 21.

For example, a plurality of pole-like compounds 31 are formed between the terminal 11 of the electronic part 10 and the terminal 21 of the electronic part 20 and extend in the direction in which the terminal 11 and the terminal 21 are opposite to each other. In this case, there is no need for the plurality of pole-like compounds 31 to extend in parallel with one another. Furthermore, there is no need for the plurality of pole-like compounds 31 extending to have the same length. In addition, there is no need for the plurality of pole-like compounds 31 to extend with positions at the same level from the surface of the terminal 11 or the terminal 21 as starting points.

Moreover, there is no need for the joining portion 30 to contain a plurality of pole-like compounds 31. The presence of at least one pole-like compound 31 in the joining portion 30 leads to the above improvement in the strength of the joining portion 30 and the appearance of a crack or peel is controlled.

$Ag_3Sn$ is taken as an example of the pole-like compound 31. However, the pole-like compound 31 may contain another crystal phase which contains Ag and Sn. Even in that case, a pole-like compound 31 is contained, so the above improvement in the strength of the joining portion 30 is achieved. As a result, the appearance of a crack or peel is controlled.

Furthermore, Sn—Ag based solder is taken as an example of the joining material 30a. However, another solder may be used as the joining material 30a. Sn—Ni based solder which contains Sn and nickel (Ni), Sn—Cu based solder which contains Sn and copper (Cu), Sn—Au based solder which contains Sn and gold (Au), Sn—Pd based solder which contains Sn and palladium (Pd), or the like may be used as the joining material 30a. Even if one of them is used as the joining material 30a, a joining portion 30 which contains a pole-like compound 31 can be formed by the use of the above joining method described in FIGS. 2A through 2C and the same effect that is described above can be obtained by the formation of the pole-like compound 31. Solder used as the joining material 30a is not limited to solder which contains two kinds of elements.

In addition, the joining material 30a is put in advance on the terminal 21 of the electronic part 20. However, the joining material 30a may be put in advance on the terminal 11 of the electronic part 10 to join the electronic part 10 and the electronic part 20.

As stated above, a semiconductor element, a semiconductor package including a semiconductor element, a circuit board, or the like is used as each of the electronic part 10 and the electronic part 20. Examples of the structure of a semiconductor element, a semiconductor package, and a circuit board will be described with reference to FIGS. 3 through 7A and 7B.

Figure 3:
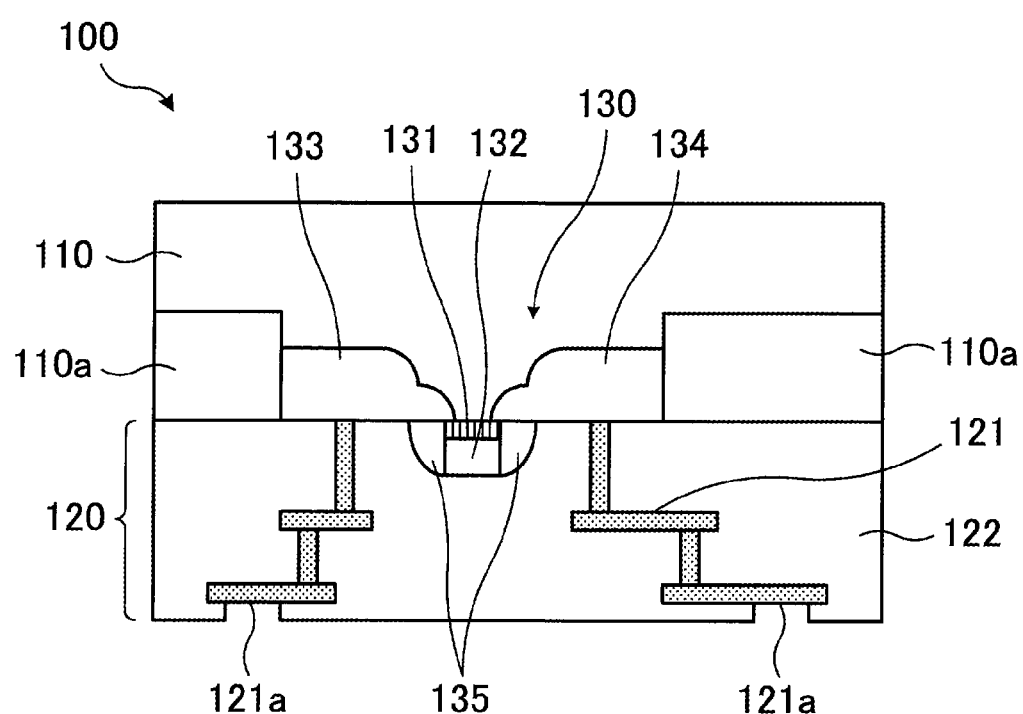
FIG. 3 illustrates an example of the structure of a semiconductor element.

FIG. 3 illustrates an example of the structure of a semiconductor element. FIG. 3 is a fragmentary schematic sectional view of an example of a semiconductor element.

A semiconductor element 100 illustrated in FIG. 3 includes a semiconductor substrate 110 in which an element, such as a transistor, is formed, and a wiring layer 120 formed over the semiconductor substrate 110.

A silicon (Si) substrate, a germanium (Ge) substrate, a silicon germanium (SiGe) substrate, a gallium arsenide (GaAs) substrate, an indium phosphide (InP) substrate, or the like is used as the semiconductor substrate 110. Elements, such as transistors, capacitors, and resistors, are formed in the semiconductor substrate 110. FIG. 3 illustrates a MOS (Metal Oxide Semiconductor) transistor 130 as an example of an element.

The MOS transistor 130 is formed in an element region demarcated by an isolation region 110a formed in the semiconductor substrate 110. The MOS transistor 130 includes a gate electrode 132 formed over the semiconductor substrate 110 with a gate insulating film 131 between and a source region 133 and a drain region 134 formed in the semiconductor substrate 110 on both sides of the gate electrode 132. A spacer (side wall) 135, which is an insulating film, is formed on the sides of the gate electrode 132.

The wiring layer 120 is formed over the semiconductor substrate 110 in which the above MOS transistor 130 and the like are formed. The wiring layer 120 includes a conductor portion (wirings and vias) 121 electrically connected to the MOS transistor 130 and the like formed in the semiconductor substrate 110 and an insulating portion 122 which covers the conductor portion 121. FIG. 3 illustrates as an example the conductor portion 121 electrically connected to the source region 133 and the drain region 134 of the MOS transistor 130. Various conductive materials, such as Cu and aluminum (Al), are used for forming the conductor portion 121. An inorganic insulating material, such as silicon oxide, or an inorganic insulating material, such as resin, is used for forming the insulating portion 122.

The conductor portion 121 in the surface of the wiring layer 120 includes portions used as terminals 121a for external connection. Bumps of solder or the like corresponding to the above joining material 30a (FIGS. 2A through 2C) are put on the terminals 121a when or before the semiconductor element 100 is joined to another electronic part.

Figure 4:
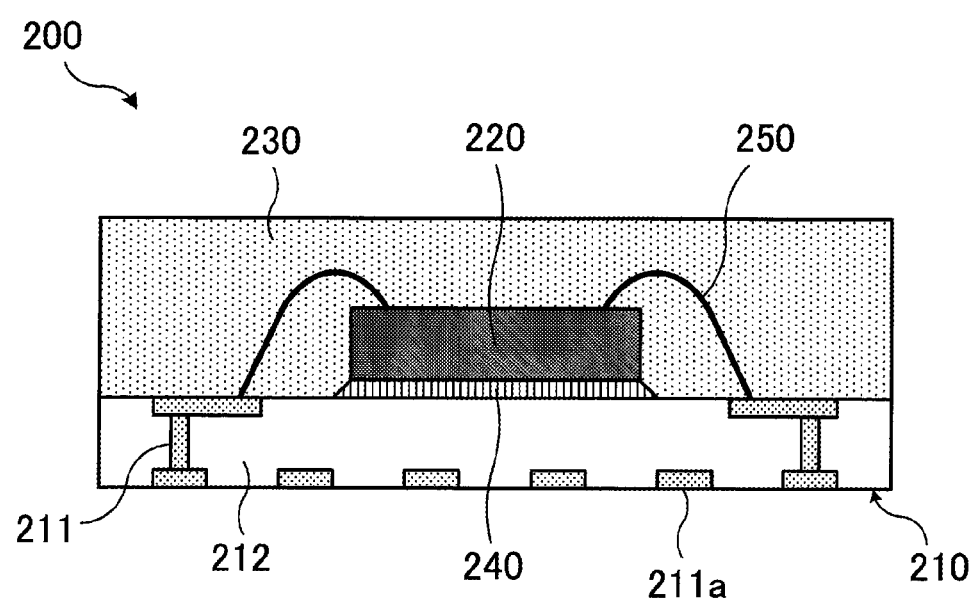
FIG. 4 illustrates an example of the structure of a semiconductor package (part 1)
Figure 5:
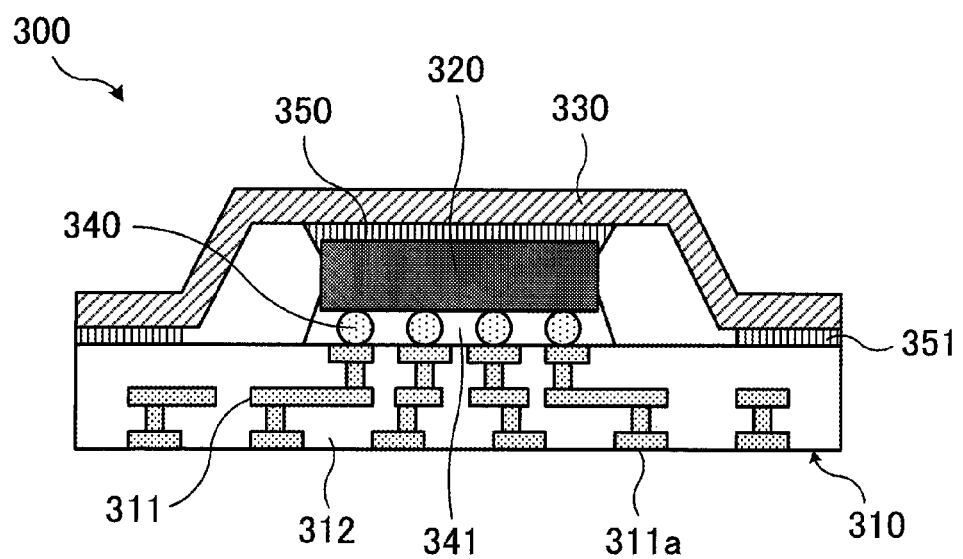
FIG. 5 illustrates an example of the structure of a semiconductor package (part 2)
Figure 6:
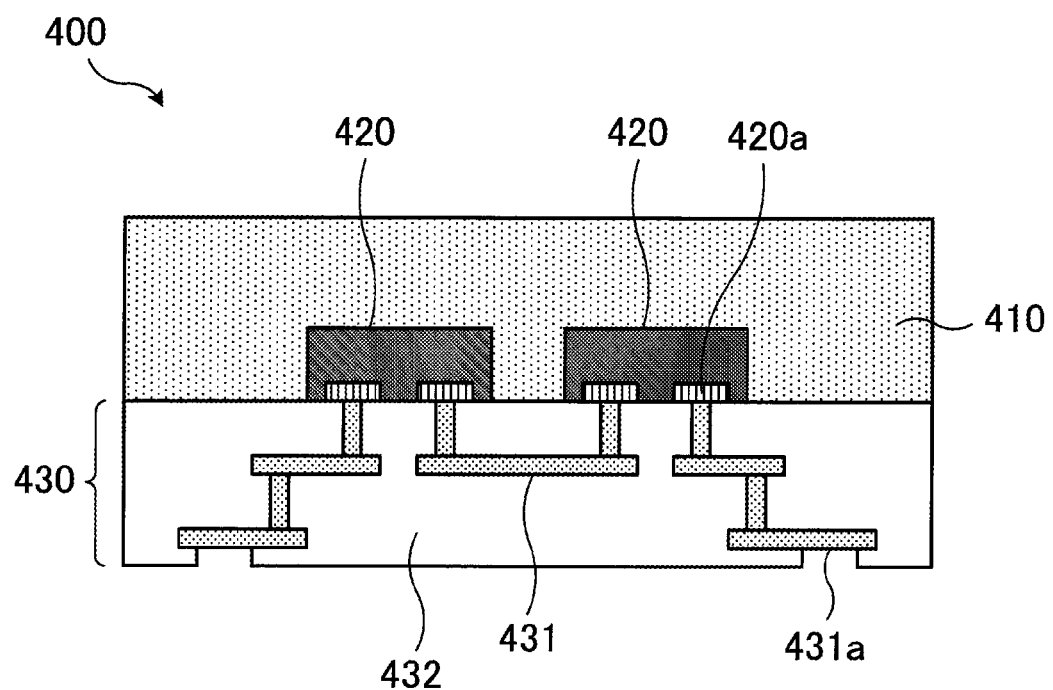
FIG. 6 illustrates an example of the structure of a semiconductor package (part 3)

Each of FIGS. 4 through 6 illustrates an example of the structure of a semiconductor package. Each of FIGS. 4 through 6 is a fragmentary schematic sectional view of an example of a semiconductor package.

First a semiconductor package 200 illustrated in FIG. 4 will be described.

A semiconductor package 200 illustrated in FIG. 4 includes a package substrate (circuit board) 210, a semiconductor element 220 mounted over the package substrate 210, and a sealing layer 230 which seals the semiconductor element 220.

A printed board or the like is used as the package substrate 210. The package substrate 210 includes a conductor portion (wirings and vias) 211 and an insulating portion 212 which covers the conductor portion 211. Various conductive materials, such as Cu and Al, are used for forming the conductor portion 211. A resin material, such as phenolic resin, epoxy resin, or polyimide resin, a composite resin material produced by impregnating glass fiber or carbon fiber with such a resin material, or the like is used for forming the insulating portion 212.

The semiconductor element 220 is attached and fixed over the above package substrate 210 by the use of a die attach material 240, such as resin or a conductive paste, and is electrically connected (wire-bonded) to the package substrate 210 with wires 250. The semiconductor element 220 and the wires 250 over the package substrate 210 are sealed by the sealing layer 230. A resin material, such as epoxy resin, a material produced by making such a resin material contain an insulating filler, or the like is used for forming the sealing layer 230.

The conductor portion 211 in the surface of the package substrate 210 opposite the surface over which the semiconductor element 220 is mounted includes portions used as terminals 211a for external connection. Bumps of solder or the like corresponding to the above joining material 30a (FIGS. 2A through 2C) are put on the terminals 211a when or before the semiconductor package 200 is joined to another electronic part.

In the example of FIG. 4, the semiconductor element 220 is wire-bonded to the package substrate 210. However, the semiconductor element 220 may be flip-chip-bonded to the package substrate 210.

Furthermore, a plurality of semiconductor elements 220 may be mounted over the package substrate 210. In addition, not only the semiconductor element 220 but also another electronic part, such as a chip capacitor, may be mounted over the package substrate 210.

Next, a semiconductor package 300 illustrated in FIG. 5 will be described.

A semiconductor package 300 illustrated in FIG. 5 includes a package substrate (circuit board) 310, a semiconductor element 320 mounted over the package substrate 310, and a covering material 330 which covers the semiconductor element 320.

A printed board or the like is used as the package substrate 310. The package substrate 310 includes a conductor portion (wirings and vias) 311 formed by the use of Cu, Al, or the like, and an insulating portion 312 which covers the conductor portion 311 and which is formed by the use of a resin material or the like.

The semiconductor element 320 is electrically connected (flip-chip-bonded) to the above package substrate 310 by bumps 340 of solder or the like formed on the semiconductor element 320. A space between the package substrate 310 and the semiconductor element 320 is filled with an under-fill material 341. The semiconductor element 320 over the package substrate 310 is covered with the covering material 330. A heat conductive material, such as Cu, is used as the covering material 330. The covering material 330 is attached to the semiconductor element 320 by the use of a thermal interface material (TIM) 350 and is thermally connected to the semiconductor element 320. For example, end portions of the covering material 330 are attached to the package substrate 310 by the use of an adhesive 351.

The conductor portion 311 in the surface of the package substrate 310 opposite the surface over which the semiconductor element 320 is mounted includes portions used as terminals 311a for external connection. Bumps of solder or the like corresponding to the above joining material 30a (FIGS. 2A through 2C) are put on the terminals 311a when or before the semiconductor package 300 is joined to another electronic part.

A plurality of semiconductor elements 320 may be mounted over the package substrate 310. In addition, not only the semiconductor element 320 but also another electronic part, such as a chip capacitor, may be mounted over the package substrate 310.

Next, a semiconductor package 400 illustrated in FIG. 6 will be described.

A semiconductor package 400 illustrated in FIG. 6 includes a resin layer 410, a plurality of (two, in this example) semiconductor elements 420 embedded in the resin layer 410, and a wiring layer (rewiring layer) 430 formed over the resin layer 410.

Each semiconductor element 420 is embedded in the resin layer 410 so that its surface in which a terminal 420a is disposed will be exposed. The wiring layer 430 includes a conductor portion (rewirings and vias) 431 formed by the use of Cu, Al, or the like, and an insulating portion 432 which covers the conductor portion 431 and which is formed by the use of a resin material or the like.

The conductor portion 431 in the surface of the wiring layer 430 includes portions used as terminals 431a for external connection. The position of a terminal 420a of each semiconductor element 420 is rearranged by the conductor portion 431 at the position of a terminal 431a for external connection. Bumps of solder or the like corresponding to the above joining material 30a (FIGS. 2A through 2C) are put on the terminals 431a when or before the semiconductor package 400 is joined to another electronic part.

One or three or more semiconductor elements 420 may be embedded in the resin layer 410. Furthermore, not only the semiconductor elements 420 but also another electronic part, such as a chip capacitor, may be embedded in the resin layer 410.

Figure 7A:
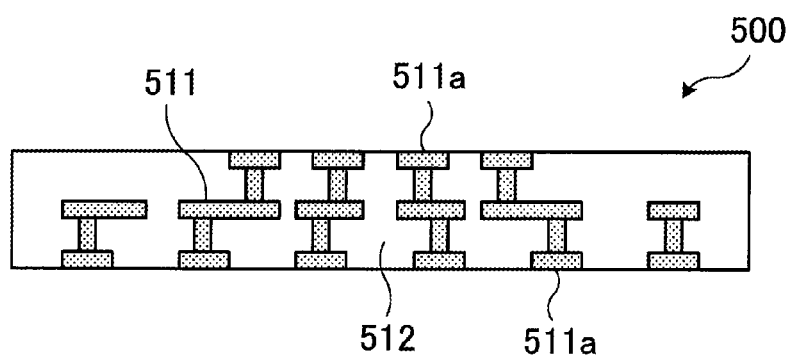
FIGS. 7A and 7B illustrate examples of the structure of a circuit board.
Figure 7B:
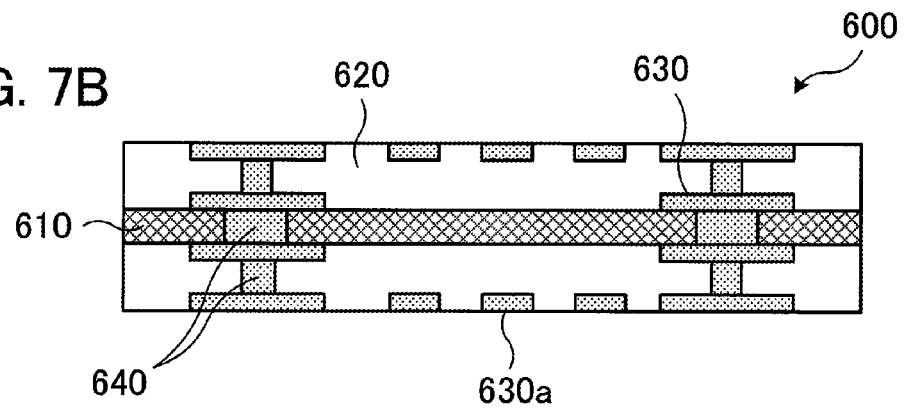

Each of FIGS. 7A and 7B illustrates an example of the structure of a circuit board. Each of FIGS. 7A and 7B is a fragmentary schematic sectional view of an example of a circuit board.

In the example of FIG. 7A, a multilayer printed circuit board including a plurality of wiring layers is illustrated as a circuit board 500. The circuit board 500 includes a conductor portion (wirings and vias) 511 formed by the use of Cu, Al, or the like, and an insulating portion 512 which covers the conductor portion 511 and which is formed by the use of a resin material or the like. This is the same with the package substrate 210 illustrated in FIG. 4 and the package substrate 310 illustrated in FIG. 5.

The conductor portion 511 in the surfaces of the circuit board 500 includes portions used as terminals 511a for external connection. Bumps of solder or the like corresponding to the above joining material 30a (FIGS. 2A through 2C) are put on the terminals 511a when or before the circuit board 500 is joined to another electronic part.

In the example of FIG. 7B, a buildup board formed by the use of a buildup method is illustrated as a circuit board 600. The circuit board 600 includes a core board 610, an insulating layer 620 formed over the core board 610, conductor patterns 630 formed with the insulating layer 620 between, and vias 640 which connect different conductor patterns 630. A ceramic material, an organic material, or the like is used for forming the core board 610. An insulating material, such as prepreg, is used for forming the insulating layer 620. A conductive material, such as Cu, is used for forming the conductor patterns 630 and the vias 640.

The conductor patterns 630 in the surfaces of the circuit board 600 include portions used as terminals 630a for external connection. Bumps of solder or the like corresponding to the above joining material 30a (FIGS. 2A through 2C) are put on the terminals 630a when or before the circuit board 600 is joined to another electronic part.

For example, the semiconductor element 100 illustrated in FIG. 3, the semiconductor package 200 illustrated in FIG. 4, the semiconductor package 300 illustrated in FIG. 5, the semiconductor package 400 illustrated in FIG. 6, the circuit board 500 illustrated in FIG. 7A, or the circuit board 600 illustrated in FIG. 7B may be used as the electronic part 10 or the electronic part 20 illustrated in FIGS. 1 and 2A through 2C.

For example, a combination of the electronic part 10 and the electronic part 20 to be joined together may be a combination of a semiconductor element and a circuit board, a combination of a semiconductor package and a circuit board, or a combination of a semiconductor element and a semiconductor package. Alternatively, a combination of the electronic part 10 and the electronic part 20 to be joined together may be a combination of semiconductor elements, a combination of semiconductor packages, or a combination of circuit boards.

By using the above joining method described in FIGS. 2A through 2C for joining each of various combinations of the electronic part 10 and the electronic part 20, the pole-like compounds 31 extending in the direction in which the terminal 11 and the terminal 21 are opposite to each other are formed in the joining portion 30 formed as a result of the solidification of the joining material 30a. Accordingly, the strength of the joining portion 30 improves. As a result, the appearance of a crack or peel in the joining portion 30 caused by external force or stress or a disconnection caused by such a crack or peel is effectively controlled.

A second embodiment will now be described.

Description will be given with a case where one of electronic parts to be joined together is a circuit board, where the other is a semiconductor package, and where they are joined together by the use of Sn—Ag based solder as an example.

Figure 8A:
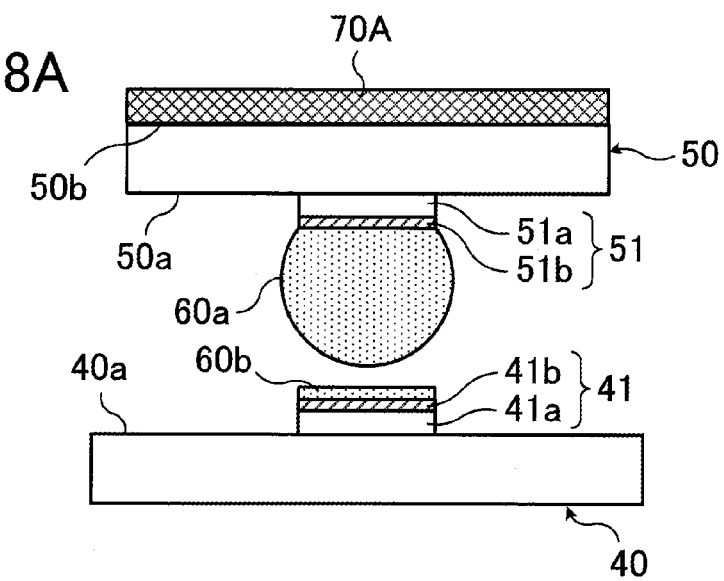
FIGS. 8A, 8B, and 8C illustrate an example of an electronic part joining process according to a second embodiment.
Figure 8B:
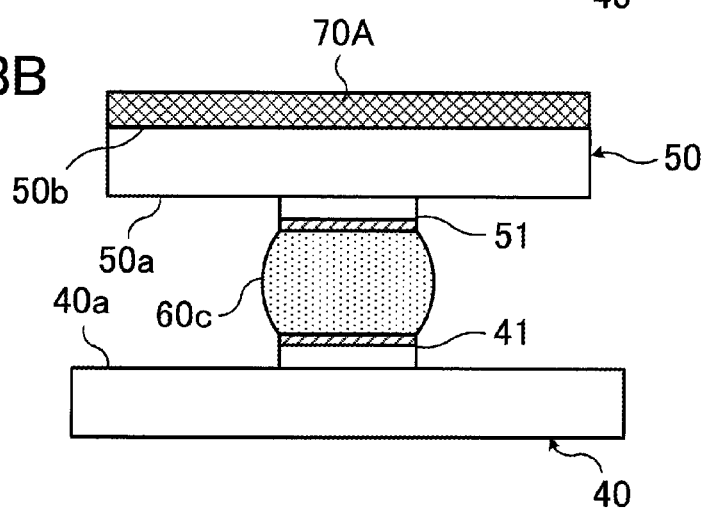
Figure 8C:
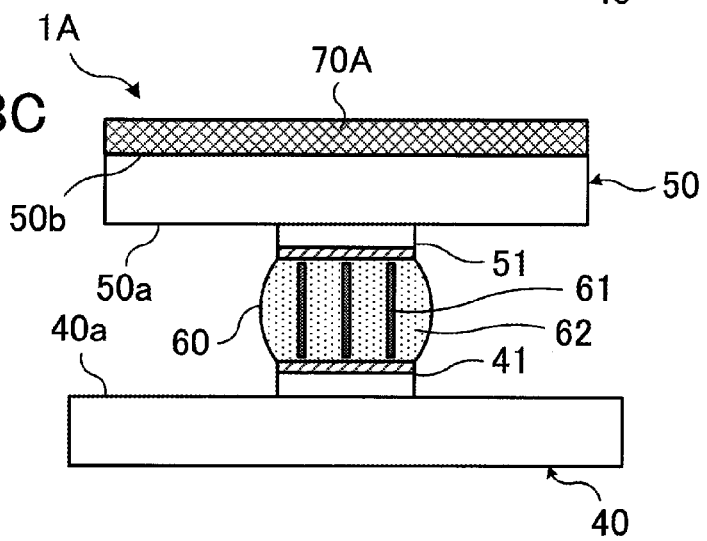

FIGS. 8A, 8B, and 8C illustrate an example of an electronic part joining process according to a second embodiment. Each of FIGS. 8A, 8B, and 8C is a fragmentary schematic sectional view of an example of an electronic part joining process according to a second embodiment. FIG. 8A illustrates an example of a state before joining. FIG. 8B illustrates an example of a state at joining time. FIG. 8C illustrates an example of a state after joining.

In this case, first a circuit board 40 and a semiconductor package 50 illustrated in FIG. 8A are prepared as electronic parts to be joined together.

The circuit board 40 has a terminal 41 formed over a surface 40a. The terminal 41 includes an electrode layer 41a formed by the use of Cu or the like and, for example, a Ni—Au electrode layer 41b formed over the electrode layer 41a and having a laminated structure of Ni and Au. A joining material 60b which is, for example, Sn—Ag—Cu solder is put in advance on the terminal 41 (electrode layer 41b) of the circuit board 40. The joining material 60b is formed, for example, by applying solder paste to the terminal 41 or depositing solder by plating.

The semiconductor package 50 is disposed opposite the circuit board 40 and has a terminal 51 formed over a surface 50a opposite the surface 40a of the circuit board 40. The terminal 51 includes an electrode layer 51a formed by the use of Cu or the like and, for example, a Ni—Au electrode layer 51b formed over the electrode layer 51a. A joining material 60a which is, for example, Sn—Ag—Cu solder is put in advance on the terminal 51 (electrode layer 51b) of the semiconductor package 50. The joining material 60a is formed, for example, by melting by heating solder put on the terminal by mounting a solder ball or depositing solder by plating and by solidifying the solder by cooling.

A member 70A having determined heat capacity is disposed over a surface (upper surface) 50b of the semiconductor package 50 opposite the surface 50a over which the terminal 51 is formed. A material having heat capacity which makes the temperature of the semiconductor package 50 over which the member 70A is disposed higher than that of the circuit board 40 at the time of melting the joining material 60a and the joining material 60b by heating and then solidifying them by cooling, as described later, is used as the member 70A. In order to make the member 70A have the determined heat capacity, a material (specific heat) is selected and its plane size and thickness are set. A plate of Cu, Al, or the like is used as the member 70A.

The member 70A is attached to the upper surface 50b of the semiconductor package 50 by the use of an adhesive such as resin or metal paste (not illustrated in FIG. 8A, 8B, or 8C). The disposition of the member 70A over the semiconductor package 50 will be described later.

As illustrated in FIG. 8A, the terminal 41 (joining material 60b) of the circuit board 40 over which the joining material 60b is formed is aligned with the terminal 51 (joining material 60a) of the semiconductor package 50 over which the joining material 60a is formed and over which the member 70A is disposed to dispose them opposite each other.

As illustrated in FIG. 8B, the joining material 60a on the terminal 51 of the semiconductor package 50 is then melted by heating and is connected to the joining material 60b on the terminal 41 of the circuit board 40 which is also melted. The joining material 60a and the joining material 60b are melted and connected in this way and are integrated with each other. A portion (joining portion) 60c formed by integrating the joining material 60a and the joining material 60b with each other in this way is solidified by cooling.

As stated above, the member 70A having the determined heat capacity is disposed over the semiconductor package 50. In the process of cooling the joining material 60a and the joining material 60b after heating, an adjustment is made by the member 70A so as to make the temperature of the semiconductor package 50 higher than that of the circuit board 40, for example, during a period from the beginning to the end of the solidification of the joining material 60a and the joining material 60b (joining portion 60c).

The heat capacity of the semiconductor package over which the member 70A is disposed is large compared with the semiconductor package 50 over which the member 70A is not disposed. Accordingly, when the joining portion 60c formed by melting the joining material 60a and the joining material 60b by heating and by integrating them with each other is cooled for solidification, the cooling rate of the semiconductor package 50 over which the member 70A is disposed is lower than that of the semiconductor package 50 over which the member 70A is not disposed. That is to say, the disposition of the member 70A makes it more difficult to cool the semiconductor package 50. For example, the cooling rate of the semiconductor package 50 over which the member 70A is disposed is 1° C./min or less.

When the joining portion 60c formed by melting the joining material 60a and the joining material 60b by heating and by integrating them with each other is cooled for solidification, not only the semiconductor package 50 but also the circuit board 40 is cooled. At this time a cooling rate of the semiconductor package 50 falls because of the presence of the member 70A. The semiconductor package 50 over which the member 70A is disposed is cooled slowly compared with the semiconductor package 50 over which the member 70A is not disposed. Meanwhile, the circuit board 40 is cooled. As a result, the temperature of the semiconductor package 50 over which the member 70A is disposed may become higher than that of the circuit board 40. The member 70A having the determined heat capacity is disposed so as to make the temperature of the semiconductor package 50 over which the member 70A is disposed in this way higher than that of the circuit board 40, for example, during a period from the beginning to the end of the solidification of the joining portion 60c.

The above member 70A is disposed and the temperature of the semiconductor package 50 is made higher than that of the circuit board 40. By doing so, a temperature gradient by which the temperature on the semiconductor package 50 side is higher than that on the circuit board 40 side is produced in the joining portion 60c at solidification time. Such a temperature gradient is produced, so the solidification of the joining portion 60c usually progresses from the circuit board 40 side at lower temperatures to the semiconductor package 50 side at higher temperatures.

The solidification progresses in this way. Accordingly, as illustrated in FIG. 8C, a pole-like compound 61 which is $Ag_3Sn$ is formed in the joining portion 60c so that it will extend in the direction in which the solidification progresses, that is to say, in the direction in which the terminal 41 of the circuit board 40 and the terminal 51 of the semiconductor package 50 are opposite to each other. In the example of FIG. 8C, a plurality of pole-like compounds 61 are illustrated. However, the number or disposition of compounds 61 is not limited to that of the compounds 61 illustrated in FIG. 8C. The pole-like compounds 61, which are $Ag_3Sn$, are covered with a portion 62 which contains Sn, Ag, and Cu contained in the joining material 60a and the joining material 60b. With the progress of the solidification, a joining portion 60 which contains the pole-like compounds is formed inside the portion 62. As a result, as illustrated in FIG. 8C, an electronic apparatus 1A in which the circuit board 40 and the semiconductor package 50 are joined by the joining portion 60 is obtained.

The Ni layer included in each of the electrode layer 41b of the terminal 41 and the electrode layer 51b of the terminal 51 has the function of preventing a solder component of the joining portion 60c or the joining portion 60 from diffusing into the foundation electrode layer 41a or electrode layer 51a formed by the use of Cu or the like. The Ni layer included in the electrode layer 41b or the electrode layer 51b may react with a solder component of the joining portion 60c or the joining portion 60 to form an intermetallic compound. The Au layer included in the electrode layer 41b or the electrode layer 51b has the function of preventing the Ni layer before joining from oxidizing. The Au layer included in the electrode layer 41b or the electrode layer 51b may react at joining time with the solder component of the joining portion 60c or the joining portion 60 to form an intermetallic compound.

As has been described, with the electronic apparatus 1A, as illustrated in FIG. 8C, the pole-like compounds 61 extending in the direction in which the terminal 41 and the terminal 51 are opposite to each other are formed in the joining portion 60 by which the terminal 41 of the circuit board 40 and the terminal 51 of the semiconductor package 50 are joined. The pole-like compounds 61 function like metal reinforcements, so the strength of the joining portion 60 against external force or stress created by heat improves. For example, the strength of the joining portion 60 against stress created in a direction which intersects the direction in which the pole-like compounds 61 extend improves. By forming the pole-like compounds 61 in the joining portion 60, for example, the lifetime of the joining portion 60 is two times or more as long as that of the joining portion 60 in which the pole-like compounds 61 are not formed in a repetitive bending test or a temperature cycling test.

The disposition of the member 70A having the determined heat capacity over the semiconductor package 50 will now be described with reference to FIGS. 9, 10A, and 10B.

Figure 9:
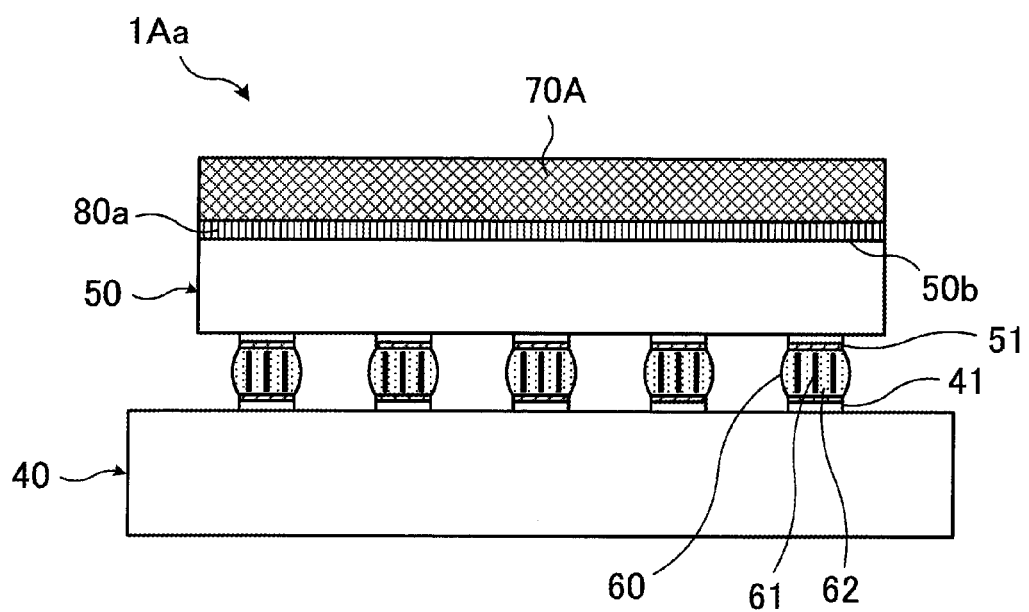
FIG. 9 illustrates a first example of the structure of an electronic apparatus according to the second embodiment.

FIG. 9 illustrates a first example of the structure of an electronic apparatus according to the second embodiment. FIG. 9 is a fragmentary schematic sectional view of a first example of the structure of an electronic apparatus according to the second embodiment.

As in an electronic apparatus 1Aa illustrated in FIG. 9, a member 70A is disposed over an upper surface 50b of a semiconductor package 50 by the use of an adhesive 80a. For example, a resin material, such as epoxy resin, is used as the adhesive 80a. Alternatively, for example, a metal paste material, such as an indium-silver (InAg) alloy or a gold-tin (AuSn) alloy, is used as the adhesive 80a.

The semiconductor package 50 to which the member 70A is attached in advance by the use of the adhesive 80a is prepared. As illustrated in FIGS. 8A through 8C, the prepared semiconductor package 50 is joined to a circuit board 40. As a result, as illustrated in FIG. 9, the electronic apparatus 1Aa in which the semiconductor package 50 to which the member 70A is attached by the use of the adhesive 80a and the circuit board 40 are joined via a joining portion 60 which contains pole-like compounds 61 is obtained. The member 70A attached to the semiconductor package 50 in the electronic apparatus 1Aa is used, for example, as a heat radiation member for radiating to the outside heat generated by the semiconductor package 50 at the time of using the electronic apparatus 1Aa.

Figure 10A:
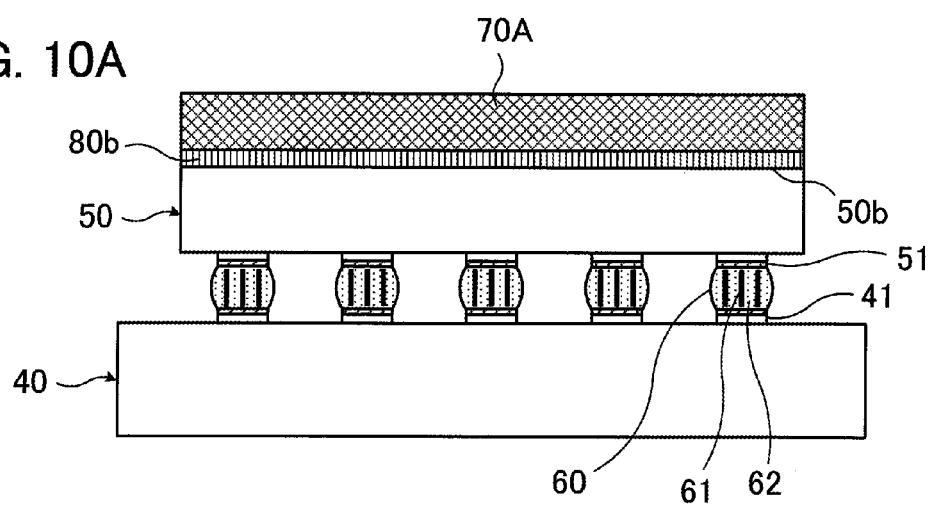
FIGS. 10A and 10B illustrate a second example of the structure of the electronic apparatus according to the second embodiment.
Figure 10B:
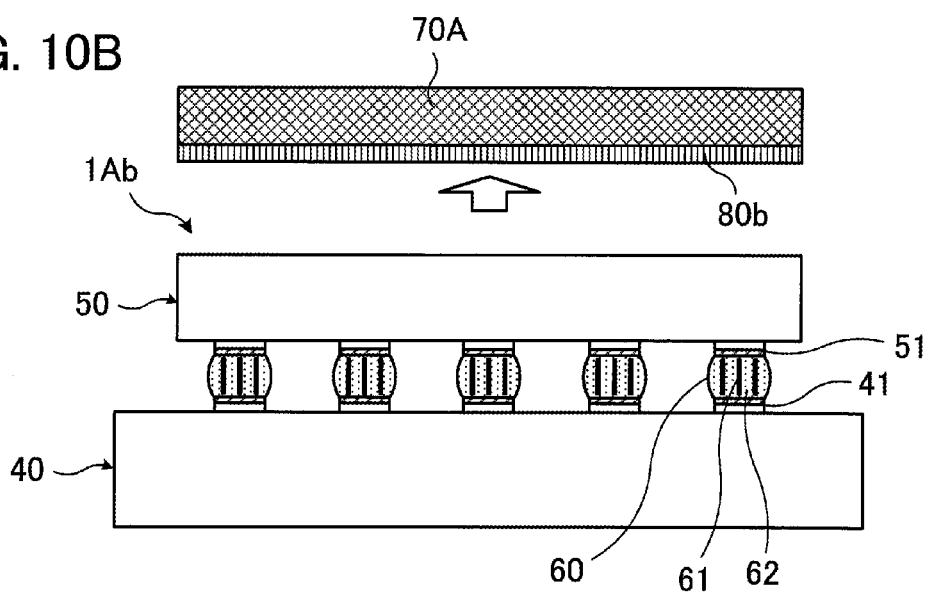

FIGS. 10A and 10B illustrate a second example of the structure of the electronic apparatus according to the second embodiment. Each of FIGS. 10A and 10B is a fragmentary schematic sectional view of a second example of the structure of the electronic apparatus according to the second embodiment.

In this example, as illustrated in FIG. 10A, a member 70A is attached to an upper surface 50b of a semiconductor package 50 by the use of an adhesive 80b. Ultraviolet curing resin is used as the adhesive 80b. When ultraviolet curing resin is irradiated with ultraviolet rays, it is cured and its detachability appears (its adhesion weakens).

Ultraviolet curing resin is used as the adhesive 80b and the semiconductor package 50 to which the member 70A is attached (temporarily attached) in advance is prepared. As illustrated in FIGS. 8A through 8C, the prepared semiconductor package 50 is joined to a circuit board 40. As a result, as illustrated in FIG. 10A, a structure in which the semiconductor package 50 to which the member 70A is temporarily attached by the use of the adhesive 80b and the circuit board 40 are joined via a joining portion 60 which contains pole-like compounds 61 is obtained.

After this structure is obtained, the adhesive 80b is irradiated with ultraviolet rays. As a result, the detachability of the adhesive 80b appears and a state in which the member 70A temporarily attached to the semiconductor package 50 and the adhesive 80b can be detached from the semiconductor package 50 arises. The member 70A and the adhesive 80b in this state are removed from over the semiconductor package 50 and an electronic apparatus 1Ab illustrated in FIG. 10B is obtained. As has been described, the member 70A is temporarily attached to the semiconductor package 50 at the time of the joining of the circuit board 40 and the semiconductor package 50, and may be removed after the joining of the circuit board 40 and the semiconductor package 50.

In the second embodiment a case where Sn—Ag based solder is used for forming the joining material 60a and the joining material 60b (joining portion 60c) and the joining portion 60 is taken as an example. However, the same applies in a case where Sn—Ni based solder, Sn—Cu based solder, Sn—Au based solder, Sn—Pd based solder, or the like is used. Furthermore, it is possible to form the above joining material 60b over the semiconductor package 50, form the above joining material 60a over the circuit board 40, and join the semiconductor package 50 and the circuit board 40.

In the second embodiment the descriptions are given with a case where the circuit board 40 and the semiconductor package 50 are joined as an example. However, the technique of using the above member 70A is also applicable in cases where various electronic parts are joined.

A third embodiment will now be described.

In a third embodiment description will be given with a case where one of electronic parts to be joined is a circuit board, where the other is a semiconductor package, and where they are joined by the use of Sn—Ag based solder as an example. This is the same with the above second embodiment.

Figure 11A:
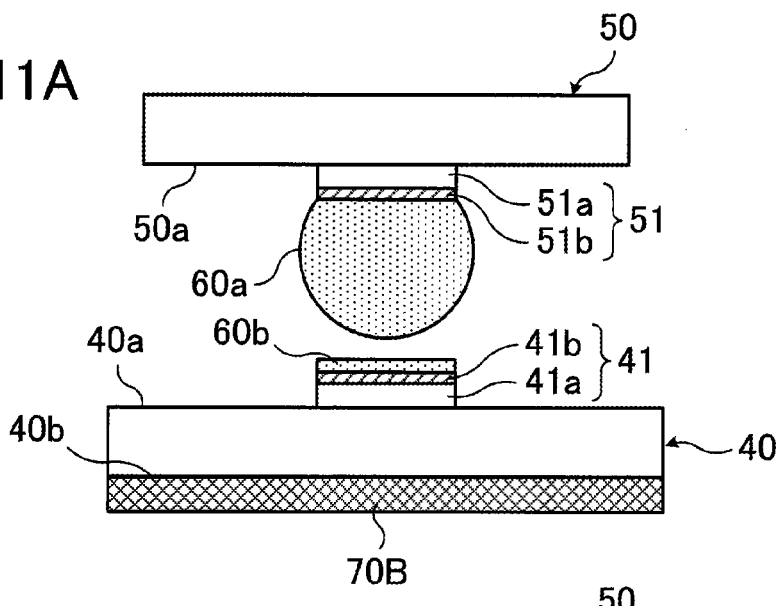
FIGS. 11A, 11B, and 11C illustrate an example of an electronic part joining process according to a third embodiment.
Figure 11B:
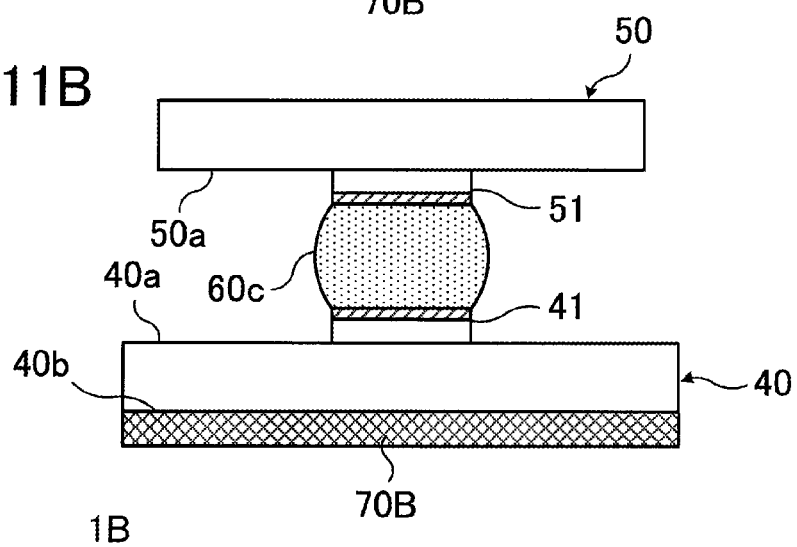
Figure 11C:
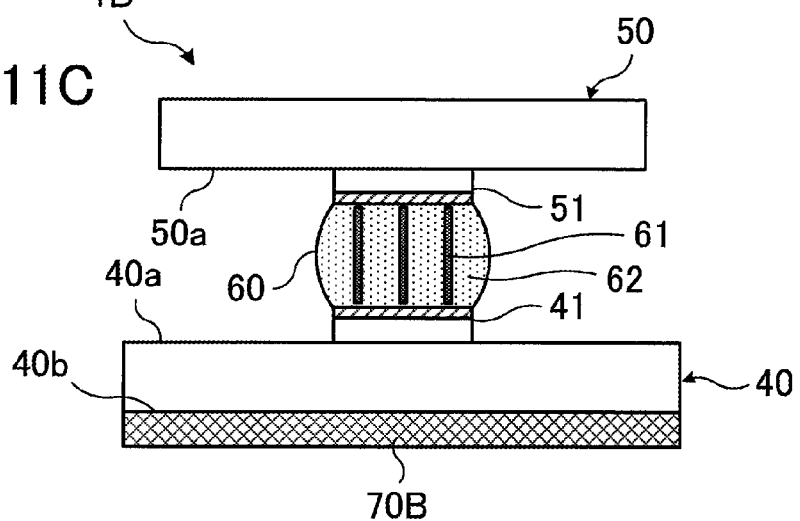

FIGS. 11A, 11B, and 11C illustrate an example of an electronic part joining process according to a third embodiment. Each of FIGS. 11A, 11B, and 11C is a fragmentary schematic sectional view of an example of an electronic part joining process according to a third embodiment. FIG. 11A illustrates an example of a state before joining. FIG. 11B illustrates an example of a state at joining time. FIG. 11C illustrates an example of a state after joining.

An electronic part joining process according a third embodiment illustrated in FIGS. 11A through 11C differs from the electronic part joining process according the above second embodiment in that a member 70B having determined heat capacity is disposed over a circuit board 40.

In the third embodiment, as illustrated in FIG. 11A, first the circuit board 40 over which the member 70B is disposed and a semiconductor package 50 are prepared as electronic parts to be joined.

The circuit board 40 has a terminal 41 formed over a surface 40a. The terminal 41 includes an electrode layer 41a formed by the use of Cu or the like and an electrode layer 41b formed by the use of, for example, Ni and Au. A joining material 60b which is, for example, Sn—Ag—Cu solder is put in advance on the terminal 41 (electrode layer 41b) of the circuit board 40.

The member 70B having the determined heat capacity is disposed over a surface (lower surface) 40b of the circuit board 40 opposite the surface 40a over which the terminal 41 is formed. A material having heat capacity which makes the temperature of the circuit board 40 over which the member 70B is disposed higher than that of the semiconductor package 50 at the time of melting a joining material 60a and the joining material 60b by heating and then solidifying them by cooling, as described later, is used as the member 70B. In order to make the member 70B have the determined heat capacity, a material (specific heat) is selected and its plane size and thickness are set. A plate of Cu, Al, or the like is used as the member 70B.

The member 70B is disposed directly on the lower surface 40b of the circuit board 40. Alternatively, the member 70B may be disposed under the lower surface 40b of the circuit board 40 by the use of an adhesive such as resin (not illustrated in FIG. 11A, 11B, or 11C). The disposition of the member 70B under the circuit board 40 will be described later.

The semiconductor package 50 is disposed opposite the circuit board 40 and has a terminal 51 formed over a surface 50a. The terminal 51 includes an electrode layer 51a formed by the use of Cu or the like and an electrode layer 51b formed by the use of, for example, Ni and Au. The joining material 60a which is, for example, Sn—Ag—Cu solder is put in advance on the terminal 51 (electrode layer 51b) of the semiconductor package 50.

As illustrated in FIG. 11A, the terminal 41 (joining material 60b) of the circuit board 40 over which the joining material 60b is put and under which the member 70B is disposed is aligned with the terminal 51 (joining material 60a) of the semiconductor package 50 over which the joining material 60a is put to dispose them opposite each other.

As illustrated in FIG. 11B, the joining material 60a on the terminal 51 of the semiconductor package 50 is then melted by heating and is connected to the joining material 60b on the terminal 41 of the circuit board 40 which is also melted. The joining material 60a and the joining material 60b are melted and connected in this way and are integrated with each other. A joining portion 60c formed by integrating the joining material 60a and the joining material 60b with each other is solidified by cooling.

As stated above, the member 70B having the determined heat capacity is disposed under the circuit board 40. In the process of cooling the joining material 60a and the joining material 60b after heating, an adjustment is made by the member 70B so as to make the temperature of the circuit board 40 higher than that of the semiconductor package 50, for example, during a period from the beginning to the end of the solidification of the joining portion 60c.

The heat capacity of the circuit board 40 under which the member 70B is disposed is large compared with the circuit board 40 under which the member 70B is not disposed. Accordingly, when the joining portion 60c formed by melting the joining material 60a and the joining material 60b and by integrating them with each other is cooled for solidification, the cooling rate of the circuit board 40 under which the member 70B is disposed is lower than that of the circuit board 40 under which the member 70B is not disposed. That is to say, the disposition of the member 70B makes it more difficult to cool the circuit board 40. For example, the cooling rate of the circuit board 40 under which the member 70B is disposed is 1° C./min or less.

When the joining portion 60c is cooled for solidification, not only the circuit board 40 but also the semiconductor package 50 is cooled. At this time the cooling rate of the circuit board 40 falls because of the presence of the member 70B. The circuit board 40 under which the member 70B is disposed is cooled slowly compared with the circuit board 40 under which the member 70B is not disposed. Meanwhile, the semiconductor package 50 is cooled. As a result, the temperature of the circuit board 40 under which the member 70B is disposed may become higher than that of the semiconductor package 50. The member 70B having the determined heat capacity is disposed so as to make the temperature of the circuit board 40 under which the member 70B is disposed in this way higher than that of the semiconductor package 50, for example, during a period from the beginning to the end of the solidification of the joining portion 60c.

The above member 70B is disposed and the temperature of the circuit board 40 is made higher than that of the semiconductor package 50. By doing so, a temperature gradient by which the temperature on the circuit board 40 side is higher than that on the semiconductor package 50 side is produced in the joining portion 60c at solidification time. Such a temperature gradient is produced, so the solidification of the joining portion 60c usually progresses from the semiconductor package 50 side at lower temperatures to the circuit board 40 side at higher temperatures.

The solidification progresses in this way. Accordingly, as illustrated in FIG. 11C, a pole-like compound 61 which is $Ag_3Sn$ is formed in the joining portion 60c so that it will extend in the direction in which the solidification progresses, that is to say, in the direction in which the terminal 41 of the circuit board 40 and the terminal 51 of the semiconductor package 50 are opposite to each other. In the example of FIG. 11C, a plurality of pole-like compounds 61 are illustrated. However, the number or disposition of compounds 61 is not limited to that of the compounds 61 illustrated in FIG. 11C. The pole-like compounds 61, which are $Ag_3Sn$, are covered with a portion 62 which contains Sn, Ag, and Cu contained in the joining material 60a and the joining material 60b. With the progress of the solidification, a joining portion 60 which contains the pole-like compounds is formed inside the portion 62. As a result, as illustrated in FIG. 11C, an electronic apparatus 1B in which the circuit board 40 and the semiconductor package 50 are joined by the joining portion 60 is obtained.

As has been described, even if the member 70B having the determined heat capacity is disposed under the circuit board 40, the pole-like compounds 61 extending in the direction in which the terminal 41 of the circuit board 40 and the terminal 51 of the semiconductor package 50 are opposite to each other are formed in the joining portion 60 by which the terminal 41 of the circuit board 40 and the terminal 51 of the semiconductor package 50 are joined. As a result, the electronic apparatus 1B in which the strength of the joining portion 60 against external force or stress created by heat is improved is obtained. In the electronic apparatus 1B, for example, the strength of the joining portion 60 against stress created in a direction which intersects the direction in which the pole-like compounds 61 extend is improved. By forming the pole-like compounds 61 in the joining portion 60, for example, the lifetime of the joining portion 60 is two times or more as long as that of the joining portion 60 in which the pole-like compounds 61 are not formed in a repetitive bending test or a temperature cycling test.

The disposition of the member 70B having the determined heat capacity under the circuit board 40 will now be described.

To place the circuit board 40 on the member 70B is possible as one of methods for disposing the member 70B under the circuit board 40. In this case, the circuit board 40 is simply placed on the member 70B. There is no need to fix the circuit board 40 onto the member 70B, for example, by attaching the circuit board 40 by the use of an adhesive. As illustrated in FIGS. 11A through 11C, the semiconductor package 50 is joined to the circuit board 40 placed in this way on the member 70B by the use of the joining material 60a and the joining material 60b. A structure after the joining is picked up from the member 70B. As a result, the electronic apparatus 1B without the member 70B in which the circuit board 40 and the semiconductor package 50 are joined by the joining portion 60 is obtained.

Furthermore, the member 70B may be disposed under the circuit board 40 by the use of an adhesive. Such a method will be described with reference to FIGS. 12, 13A, and 13B.

Figure 12:
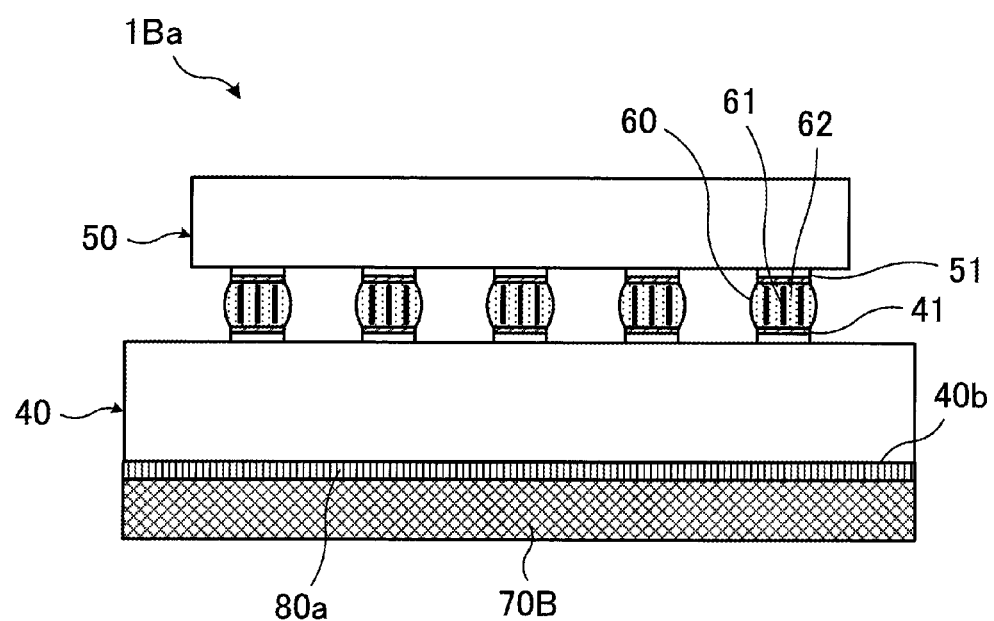
FIG. 12 illustrates a first example of the structure of an electronic apparatus according to the third embodiment.

FIG. 12 illustrates a first example of the structure of an electronic apparatus according to the third embodiment. FIG. 12 is a fragmentary schematic sectional view of a first example of the structure of an electronic apparatus according to the third embodiment.

If the circuit board 40 is a single-sided circuit board and does not have a circuit pattern or a terminal for external connection on the lower surface 40b, then the member 70B may be disposed under the lower surface 40b of the circuit board 40 by the use of an adhesive 80a such as a resin material or a metal paste material as illustrated in FIG. 12. The circuit board 40 to which the member 70B is attached in advance by the use of the adhesive 80a is prepared. As illustrated in FIGS. 11A through 11C, the prepared circuit board 40 and the semiconductor package 50 are joined by the use of the joining material 60a and the joining material 60b. As a result, as illustrated in FIG. 12, an electronic apparatus 1Ba in which the semiconductor package 50 and the circuit board 40 to which the member 70B is attached by the use of the adhesive 80a are joined via a joining portion 60 which contains pole-like compounds 61 is obtained. The member 70B attached to the circuit board 40 in the electronic apparatus 1Ba is used as a heat radiation member for radiating to the outside heat conducted to the circuit board 40 at the time of using the electronic apparatus 1Ba.

Figure 13A:
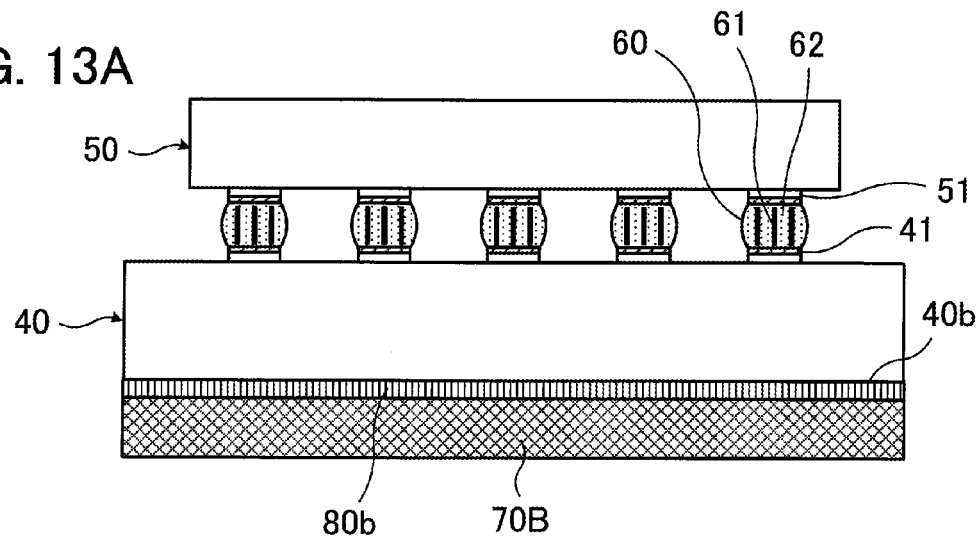
FIGS. 13A and 13B illustrate a second example of the structure of the electronic apparatus according to the third embodiment.
Figure 13B:
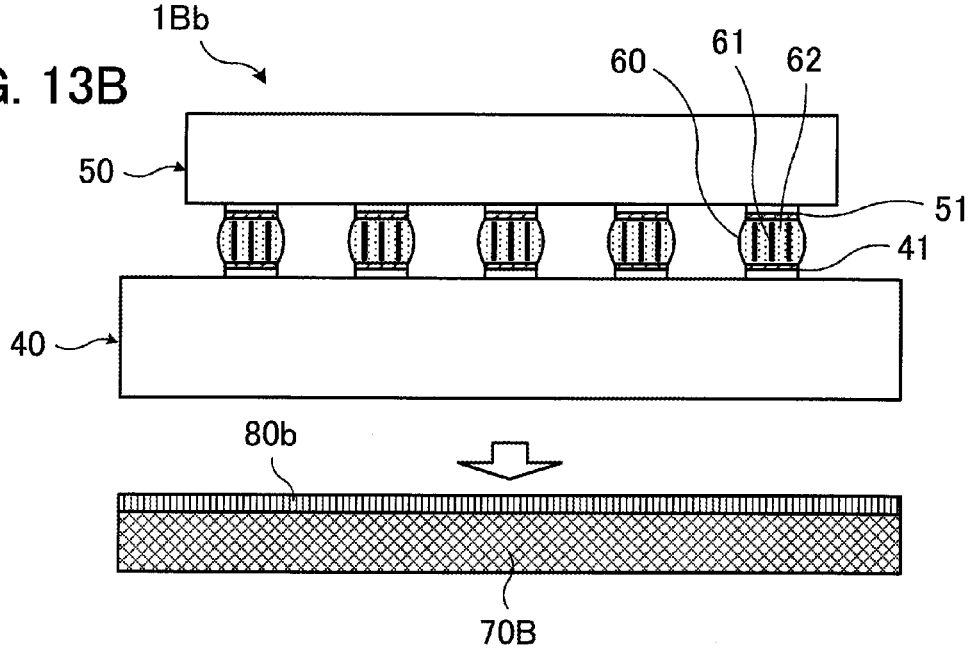

FIGS. 13A and 13B illustrate a second example of the structure of the electronic apparatus according to the third embodiment. Each of FIGS. 13A and 13B is a fragmentary schematic sectional view of a second example of the structure of the electronic apparatus according to the third embodiment.

In this example, as illustrated in FIG. 13A, an adhesive 80b, which is ultraviolet curing resin, is used for attaching a member 70B to a lower surface 40b of a circuit board 40. The circuit board 40 to which the member 70B is attached (temporarily attached) in advance by the use of the above adhesive 80b is prepared and is joined, as illustrated in FIGS. 11A through 11C, to a semiconductor package 50 by the use of a joining material 60a and a joining material 60b.

As a result, as illustrated in FIG. 13A, a structure in which the semiconductor package 50 and the circuit board 40 to which the member 70B is temporarily attached by the use of the adhesive 80b are joined via a joining portion 60 which contains pole-like compounds 61 is obtained. After that, the adhesive 80b is irradiated with ultraviolet rays and the member 70B and the adhesive 80b are removed from under the circuit board 40 and an electronic apparatus 1Bb illustrated in FIG. 13B is obtained. As has been described, the member 70B is temporarily attached to the circuit board 40 at the time of the joining of the circuit board 40 and the semiconductor package 50, and may be removed after the joining of the circuit board 40 and the semiconductor package 50.

In the third embodiment a case where Sn—Ag based solder is used for forming the joining material 60a and the joining material 60b (joining portion 60c) and the joining portion 60 is taken as an example. However, the same applies in a case where Sn—Ni based solder, Sn—Cu based solder, Sn—Au based solder, Sn—Pd based solder, or the like is used. Furthermore, it is possible to form the above joining material 60b over the semiconductor package 50, form the above joining material 60a over the circuit board 40, and join the semiconductor package 50 and the circuit board 40.

In the third embodiment the descriptions are given with a case where the circuit board 40 and the semiconductor package 50 are joined as an example. However, the technique of using the above member 70B is also applicable in cases where various electronic parts are joined.

A fourth embodiment will now be described.

In a fourth embodiment description will be given with a case where one of electronic parts to be joined is a circuit board, where the other is a semiconductor package, and where they are joined by the use of Sn—Ag based solder as an example. This is the same with the above second or third embodiment.

Figure 14A:
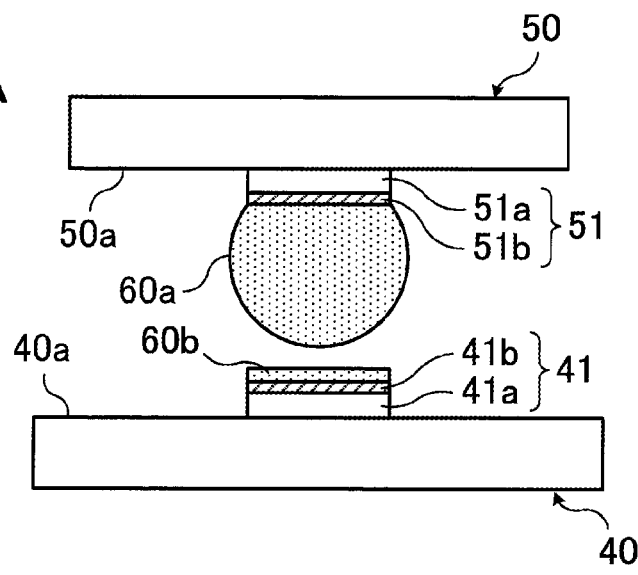
FIGS. 14A, 14B, and 14C illustrate an example of an electronic part joining process according to a fourth embodiment.
Figure 14B:
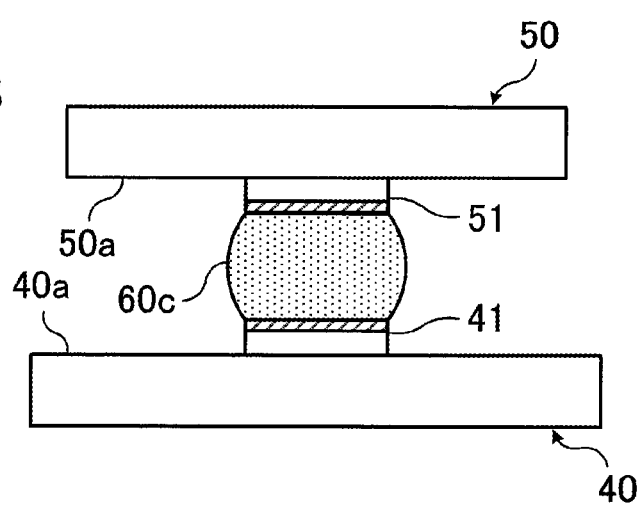
Figure 14C:
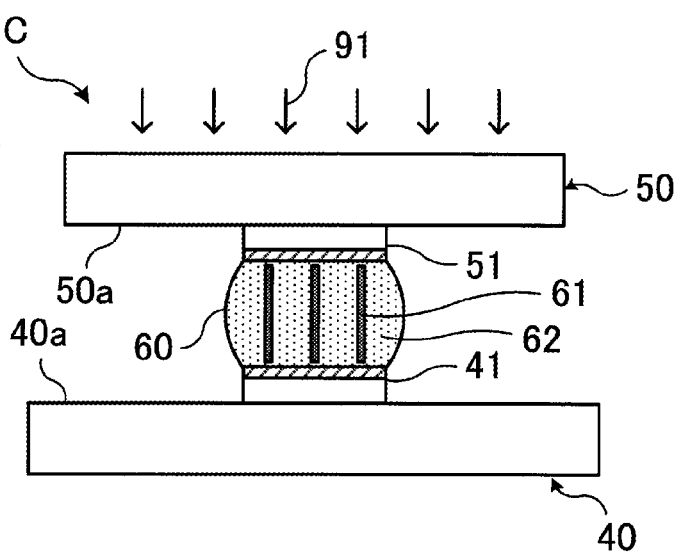

FIGS. 14A, 14B, and 14C illustrate an example of an electronic part joining process according to a fourth embodiment. Each of FIGS. 14A, 14B, and 14C is a fragmentary schematic sectional view of an example of an electronic part joining process according to a fourth embodiment. FIG. 14A illustrates an example of a state before joining. FIG. 14B illustrates an example of a state at joining time. FIG. 14C illustrates an example of a state after joining.

In this example, as illustrated in FIG. 14A, first a circuit board 40 and a semiconductor package 50 are prepared as electronic parts to be joined.

The circuit board 40 has a terminal 41 formed over a surface 40a. The terminal 41 includes an electrode layer 41a formed by the use of Cu or the like and an electrode layer 41b formed by the use of, for example, Ni and Au. A joining material 60b which is, for example, Sn—Ag—Cu solder is put in advance on the terminal 41 (electrode layer 41b) of the circuit board 40.

The semiconductor package 50 is disposed opposite the circuit board 40 and has a terminal 51 formed over a surface 50a. The terminal 51 includes an electrode layer 51a formed by the use of Cu or the like and an electrode layer 51b formed by the use of, for example, Ni and Au. A joining material 60a which is, for example, Sn—Ag—Cu solder is put in advance on the terminal 51 (electrode layer 51b) of the semiconductor package 50.

As illustrated in FIG. 14A, the terminal 41 (joining material 60b) of the circuit board 40 over which the joining material 60b is put is aligned with the terminal 51 (joining material 60a) of the semiconductor package 50 over which the joining material 60a is put to dispose them opposite each other.

As illustrated in FIG. 14B, the joining material 60a on the terminal 51 of the semiconductor package 50 is then melted by heating and is connected to the joining material 60b on the terminal 41 of the circuit board 40 which is also melted. The joining material 60a and the joining material 60b are melted and connected in this way and are integrated with each other. A joining portion 60c formed by integrating the joining material 60a and the joining material 60b with each other is solidified by cooling.

When the joining portion 60c is cooled, one of the circuit board 40 and the semiconductor package 50 is selectively cooled. In this case, for example, the semiconductor package 50 is selectively cooled. As illustrated in FIG. 14C, for example, air 91 is selectively sent to the semiconductor package 50 by the use of a fan or the like to cool the semiconductor package 50. The semiconductor package 50 is cooled in this way by sending the air 91 thereto to raise its cooling rate.

When the joining portion 60c is cooled for solidification, both of the circuit board 40 and the semiconductor package 50 are cooled. At this time the air 91 is selectively sent to the semiconductor package 50 to raise the cooling rate of the semiconductor package 50. As a result, the temperature of the circuit board 40 may become higher than that of the semiconductor package 50. The semiconductor package 50 is cooled by sending the air 91 thereto in this way. By doing so, an adjustment is made so as to make the temperature of the circuit board 40 higher than that of the semiconductor package 50, for example, during a period from the beginning to the end of the solidification of the joining portion 60c.

The temperature of the circuit board 40 is made higher than that of the semiconductor package 50. By doing so, a temperature gradient by which the temperature on the circuit board 40 side is higher than that on the semiconductor package 50 side is produced in the joining portion 60c at solidification time. Such a temperature gradient is produced, so the solidification of the joining portion 60c usually progresses from the semiconductor package 50 side at lower temperatures to the circuit board 40 side at higher temperatures.

The solidification progresses in this way. Accordingly, as illustrated in FIG. 14C, a pole-like compound 61 which is $Ag_3Sn$ is formed in the joining portion 60c so that it will extend in the direction in which the terminal 41 of the circuit board 40 and the terminal 51 of the semiconductor package 50 are opposite to each other. In the example of FIG. 14C, a plurality of pole-like compounds 61 are illustrated. However, the number or disposition of compounds 61 is not limited to that of the compounds 61 illustrated in FIG. 14C. The pole-like compounds 61, which are $Ag_3Sn$, are covered with a portion 62 which contains Sn, Ag, and Cu contained in the joining material 60a and the joining material 60b. With the progress of the solidification, a joining portion 60 which contains the pole-like compounds 61 is formed inside the portion 62. As a result, as illustrated in FIG. 14C, an electronic apparatus 1C in which the circuit board 40 and the semiconductor package 50 are joined by the joining portion 60 is obtained.

As has been described, the pole-like compounds 61 extending in the direction in which the terminal 41 of the circuit board 40 and the terminal 51 of the semiconductor package 50 are opposite to each other are also formed in the joining portion 60 between the circuit board 40 and the semiconductor package 50 by the method of selectively sending the air 91 to the semiconductor package 50. As a result, the electronic apparatus 1C in which the strength of the joining portion 60 against external force or stress created by heat is improved is obtained. In the electronic apparatus 1C, for example, the strength of the joining portion 60 against stress created in a direction which intersects the direction in which the pole-like compounds 61 extend is improved.

Figure 15:
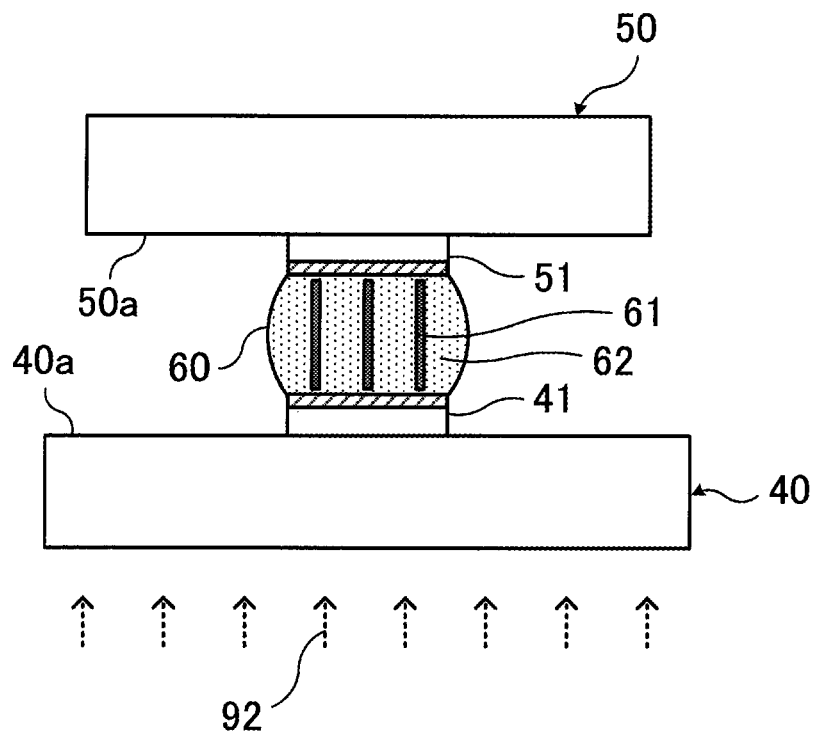
FIG. 15 is a view for describing another example of the electronic part joining process according to the fourth embodiment (part 1)
Figure 16:
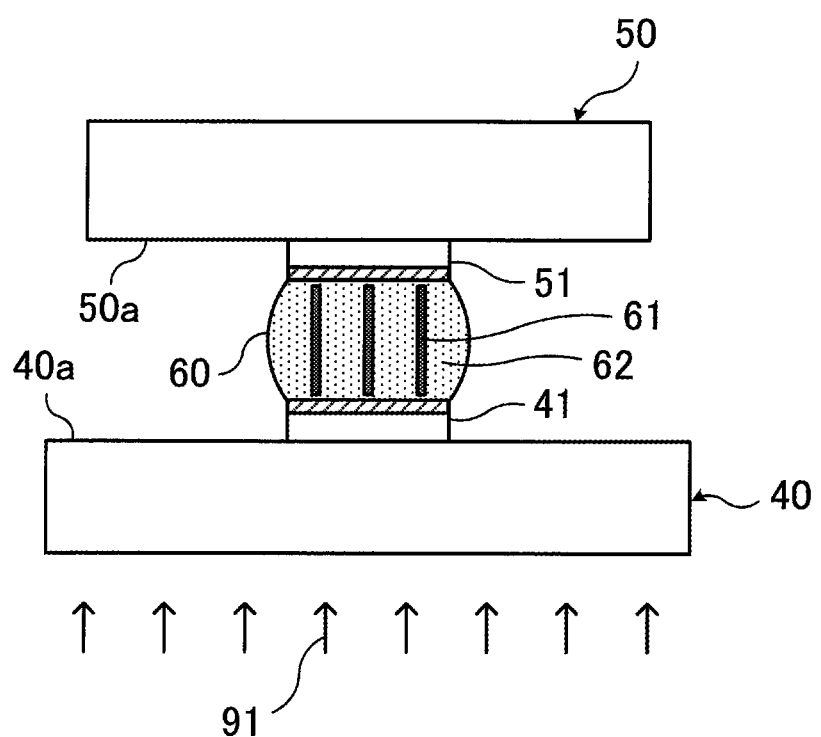
FIG. 16 is a view for describing another example of the electronic part joining process according to the fourth embodiment (part 2)
Figure 17:
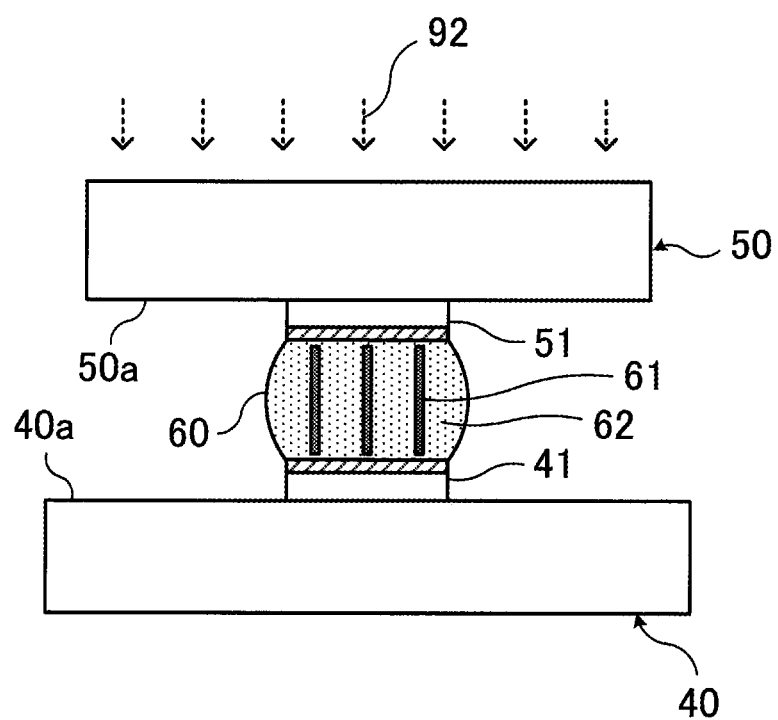
FIG. 17 is a view for describing another example of the electronic part joining process according to the fourth embodiment (part 3)

Each of FIGS. 15 through 17 is a view for describing another example of the electronic part joining process according to the fourth embodiment. Each of FIGS. 15 through 17 is a fragmentary schematic sectional view of another example of the electronic part joining process according to the fourth embodiment.

FIG. 14C illustrates a case where the air 91 is selectively sent to the semiconductor package 50, at the time of the joining portion 60c illustrated in FIG. 14B being cooled for solidification, for cooling the semiconductor package 50 and where the temperature of the circuit board 40 is made higher than that of the semiconductor package 50 as an example.

In addition, in order to make the temperature of the circuit board 40 higher than that of the semiconductor package 50 at the time of the joining portion 60c illustrated in FIG. 14B being cooled for solidification, the method of selectively applying heat 92 to the circuit board 40 by the use of a heater or the like, as illustrated in FIG. 15, may be adopted. By applying the heat 92, the circuit board 40 is heated and its cooling rate is lowered. This method is used for producing in the joining portion 60c at solidification time a temperature gradient by which the temperature on the circuit board 40 side is higher than that on the semiconductor package 50 side. By doing so, the solidification of the joining portion 60c usually progresses to the circuit board 40 side. As a result, the above pole-like compounds 61 which are $Ag_3Sn$ are formed.

FIG. 14C illustrates the case where the air 91 is selectively sent to the semiconductor package 50 as an example. As illustrated in FIG. 16, however, air 91 may be selectively sent to a circuit board 40 for making the temperature of a semiconductor package 50 higher than that of the circuit board 40. In this case, as illustrated in FIGS. 14A and 14B, first the circuit board 40 and the semiconductor package 50 are disposed opposite each other, a joining material 60a and a joining material 60b are melted and connected, and a joining portion 60c is formed. After that, the joining portion 60c is solidified by cooling. At cooling time the air 91 is selectively sent to the circuit board 40 by the use of a fan or the like to cool the circuit board 40. The circuit board 40 is cooled in this way by sending the air 91 thereto to raise its cooling rate. By doing so, the temperature of the semiconductor package 50 is made higher than that of the circuit board 40, for example, during a period from the beginning to the end of the solidification of the joining portion 60c. This method is used for producing in the joining portion 60c at solidification time a temperature gradient by which the temperature on the semiconductor package 50 side is higher than that on the circuit board 40 side. As a result, the solidification of the joining portion 60c usually progresses to the semiconductor package 50 side and the above pole-like compounds 61 which are $Ag_3Sn$ are formed.

As illustrated in FIG. 17, in order to make the temperature on a semiconductor package 50 side higher than that on a circuit board 40 side, the method of selectively applying heat 92 to the semiconductor package 50 by the use of a heater or the like may be adopted. By applying the heat 92 to the semiconductor package 50, the semiconductor package 50 is heated and its cooling rate is lowered. This method is used for producing in the joining portion 60c at solidification time a temperature gradient by which the temperature on the semiconductor package 50 side is higher than that on the circuit board 40 side. As a result, the above pole-like compounds 61 which are $Ag_3Sn$ are formed.

In the fourth embodiment a case where Sn—Ag based solder is used for forming the joining material 60a and the joining material 60b (joining portion 60c) and a joining portion 60 is taken as an example. However, the same applies in a case where Sn—Ni based solder, Sn—Cu based solder, Sn—Au based solder, Sn—Pd based solder, or the like is used. Furthermore, it is possible to form the above joining material 60b over the semiconductor package 50, form the above joining material 60a over the circuit board 40, and join the semiconductor package 50 and the circuit board 40.

In the fourth embodiment the descriptions are given with a case where the circuit board 40 and the semiconductor package 50 are joined as an example. However, the technique of sending the air 91 or applying the heat 92 is also applicable in cases where various electronic parts are joined.

The electronic apparatus 1, 1A (1Aa and 1Ab), 1B (1Ba and 1Bb), and 1C according to the above first through fourth embodiments, respectively, are fabricated, for example, by the use of the following fabrication apparatus. Description will now be given with a case where one of electronic parts to be joined is a circuit board 40 and where the other is a semiconductor package 50 as an example.

Figure 18:
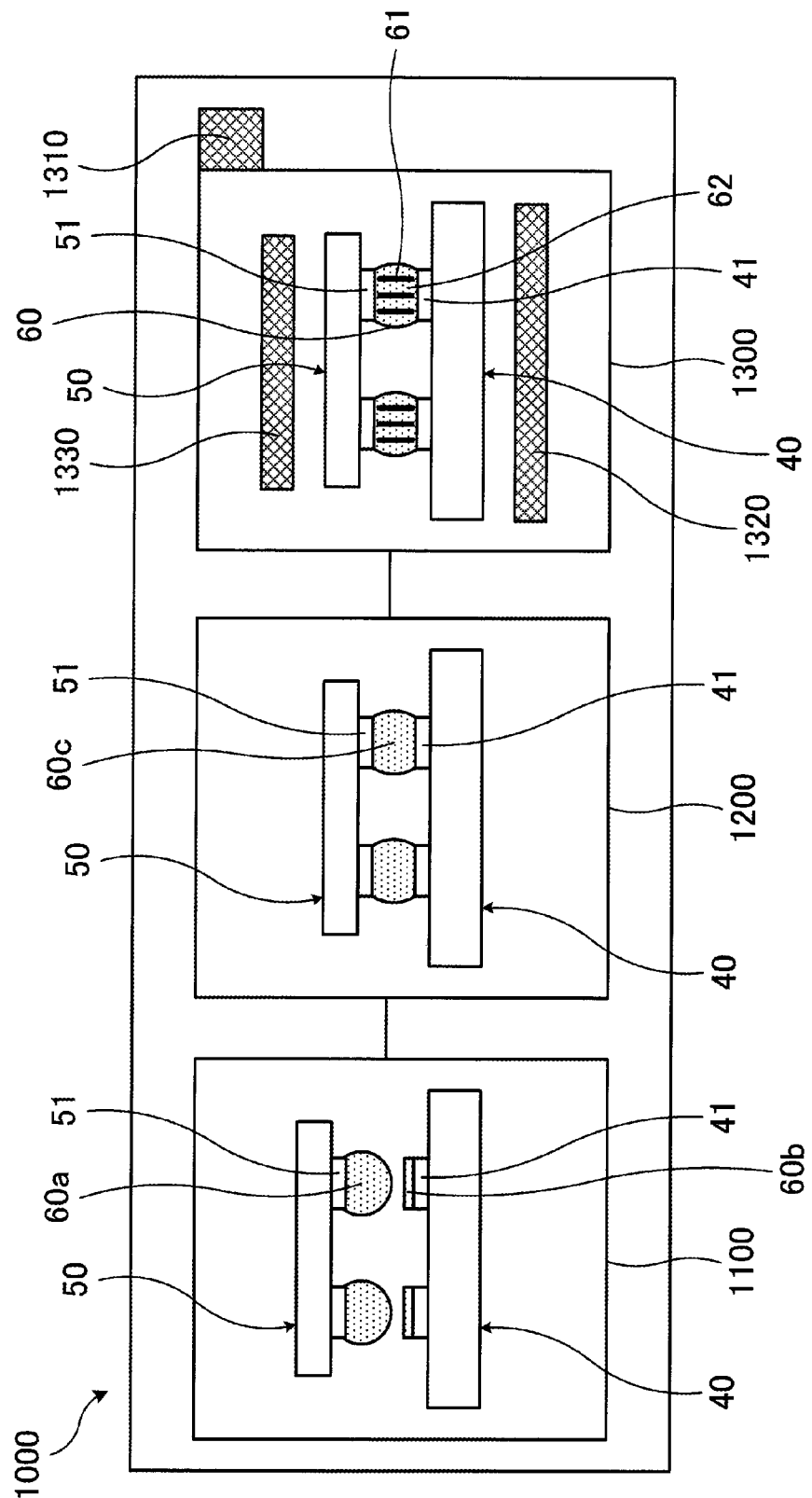
FIG. 18 illustrates an example of an apparatus for fabricating an electronic apparatus.

FIG. 18 illustrates an example of an apparatus for fabricating an electronic apparatus.

A fabrication apparatus 1000 illustrated in FIG. 18 includes a disposition section 1100, a heating section 1200, and a cooling section 1300.

First the prepared circuit board 40 and semiconductor package 50 are transported to the disposition section 1100, are aligned with each other in the disposition section 1100, and are disposed opposite each other there. The prepared circuit board 40 and semiconductor package 50 are, for example, a circuit board 40 and a semiconductor package 50 over which a member 70A is disposed. Otherwise the prepared circuit board 40 and semiconductor package 50 may be, for example, a circuit board 40 under which a member 70B is disposed and a semiconductor package 50. Otherwise the prepared circuit board 40 and semiconductor package 50 may be, for example, a circuit board 40 under which a member 70B is not disposed and a semiconductor package 50 over which a member 70A is not disposed. For convenience, the member 70A or the member 70B is not illustrated in FIG. 18.

The circuit board 40 and the semiconductor package 50 aligned with each other are transported to the heating section 1200 located behind the disposition section 1100, and are heated at a temperature corresponding to the types of a joining material 60b and a joining material 60a formed over the circuit board 40 and the semiconductor package 50 respectively. This heating is performed in an atmosphere of an inert gas. In the heating section 1200, the joining material 60b formed over the circuit board 40 and the joining material 60a formed over the semiconductor package 50 are melted, are connected, and are integrated with each other to form a joining portion 60c. In the heating section 1200, heating temperature may be raised by stages. That is to say, heating at a lower temperature (preheating) and heating at a higher temperature (main heating) may be performed.

The circuit board 40 and the semiconductor package 50 between which the joining portion 60c is formed by heating are transported to the cooling section 1300 located behind the heating section 1200, and the joining portion 60c is solidified by cooling. This cooling is performed in an atmosphere of an inert gas.

The cooling section 1300 includes a temperature controller 1310 which controls the entire temperature of an internal atmosphere by purge or the like for cooling the circuit board 40, the semiconductor package 50, and the joining portion 60c. In addition to the above temperature controller 1310, the cooling section 1300 includes a temperature controller 1320 located on the circuit board 40 side and a temperature controller 1330 located on the semiconductor package 50 side. The temperature controller 1320 has, for example, an air sending function, a heating function, or both of them. The temperature controller 1330 has, for example, an air sending function, a heating function, or both of them.

If the prepared circuit board 40 and semiconductor package 50 are a circuit board 40 under which a member 70B is disposed and a semiconductor package 50 over which a member 70A is disposed, then the temperature controller 1310 is used for performing the cooling and the formation of the joining portion 60 described in the above second or third embodiment. In this case, there is no need to use the temperature controller 1320 or the temperature controller 1330.

If the prepared circuit board 40 and semiconductor package 50 are a circuit board 40 under which a member 70B is not disposed and a semiconductor package 50 over which a member 70A is not disposed, then the temperature controller 1310 and the temperature controller 1320 or the temperature controller 1330 are used. That is to say, the temperature controller 1320 or the temperature controller 1330 is used for selectively heating or cooling one of the circuit board 40 and the semiconductor package 50. As a result, the cooling and the formation of the joining portion 60 described in the above fourth embodiment are performed.

For example, the fabrication apparatus 1000 whose structure is illustrated in FIG. 18 is used for fabricating the electronic apparatus 1, 1A (1Aa and 1Ab), 1B (1Ba and 1Bb), and 1C according to the above first through fourth embodiments respectively.

Examples are as follows.

Example 1

A Cu plate (member) is disposed over a rear of a semiconductor package whose plane size is 35 mm×35 mm. The Cu plate is equal in size to the semiconductor package. The semiconductor package over the rear of which the Cu plate is disposed and a circuit board are then joined by the use of a Sn-3.0Ag-0.5Cu (3.0 wt % of Ag and 0.5 wt % of Cu) solder ball. This joining is performed for 2 minutes in an atmosphere of nitrogen ($O_2$ concentration is 100 ppm or less) at temperature which is basically 217° C. and which does not exceed 245° C.

After it is ascertained that there is no problem about continuity of a joining portion of an electronic apparatus obtained by joining the circuit board and the semiconductor package in this way, the reliability of the joining portion is estimated. The rate of a rise in the resistance after 1000 cycles of a temperature cycling test from −40 to 125° C. is 10 percent or less and a good result is obtained. Furthermore, after the electronic apparatus is left for 1000 hours in an environment in which the temperature is 121° C. and in which the humidity is 85%, the rate of a rise in the resistance is 10 percent or less and a good result is obtained. This is the same with the temperature cycling test. A section of the joining portion is observed by the use of an electron microscope. As a result, it is ascertained that a pole-like compound, which is $Ag_3Sn$, extending in a direction in which terminals of the circuit board and the semiconductor package are opposite to each other is formed between the terminals of the circuit board and the semiconductor package.

Example 2

An Al plate (member) is disposed over a rear of a semiconductor package whose plane size is 35 mm×35 mm. The Al plate is equal in size to the semiconductor package. The semiconductor package over the rear of which the Al plate is disposed and a circuit board are then joined by the use of a Sn-3.0Ag-0.5Cu (3.0 wt % of Ag and 0.5 wt % of Cu) solder ball. This joining is performed for 2 minutes in an atmosphere of nitrogen ($O_2$ concentration is 100 ppm or less) at temperature which is basically 217° C. and which does not exceed 245° C.

After it is ascertained that there is no problem about continuity of a joining portion of an electronic apparatus obtained by joining the circuit board and the semiconductor package in this way, the reliability of the joining portion is estimated. The rate of a rise in the resistance after 1000 cycles of a temperature cycling test from −40 to 125° C. is 10 percent or less and a good result is obtained. Furthermore, after the electronic apparatus is left for 1000 hours in an environment in which the temperature is 121° C. and in which the humidity is 85%, the rate of a rise in the resistance is 10 percent or less and a good result is obtained. This is the same with the temperature cycling test. A section of the joining portion is observed by the use of an electron microscope. As a result, it is ascertained that a pole-like compound, which is $Ag_3Sn$, extending in a direction in which terminals of the circuit board and the semiconductor package are opposite to each other is formed between the terminals of the circuit board and the semiconductor package.

Example 3

A Cu plate (member) is disposed over a rear of a semiconductor package whose plane size is 35 mm×35 mm. The Cu plate is equal in size to the semiconductor package. The semiconductor package over the rear of which the Cu plate is disposed and a circuit board are then joined by the use of a Sn-57Bi-1.0Ag (57 wt % of Bi and 1.0 wt % of Ag) solder ball. This joining is performed for 3 minutes in an atmosphere of nitrogen ($O_2$ concentration is 100 ppm or less) at temperature which is basically 139° C. and which does not exceed 210° C.

After it is ascertained that there is no problem about continuity of a joining portion of an electronic apparatus obtained by joining the circuit board and the semiconductor package in this way, the reliability of the joining portion is estimated. The rate of a rise in the resistance after 1000 cycles of a temperature cycling test from −40 to 125° C. is 10 percent or less and a good result is obtained. Furthermore, after the electronic apparatus is left for 1000 hours in an environment in which the temperature is 121° C. and in which the humidity is 85%, the rate of a rise in the resistance is 10 percent or less and a good result is obtained. This is the same with the temperature cycling test. A section of the joining portion is observed by the use of an electron microscope. As a result, it is ascertained that a pole-like compound, which is $Ag_3Sn$, extending in a direction in which terminals of the circuit board and the semiconductor pack-

Example 4

A Cu plate (member) is disposed under a rear of a circuit board. The Cu plate is equal in size to the circuit board. The circuit board under the rear of which the Cu plate is disposed and a semiconductor package whose plane size is 35 mm×35 mm are then joined by the use of a Sn-57Bi-1.0Ag (57 wt % of Bi and 1.0 wt % of Ag) solder ball. This joining is performed for 3 minutes in an atmosphere of nitrogen ($O_2$ concentration is 100 ppm or less) at temperature which is basically 139° C. and which does not exceed 210° C.

After it is ascertained that there is no problem about continuity of a joining portion of an electronic apparatus obtained by joining the circuit board and the semiconductor package in this way, the reliability of the joining portion is estimated. The rate of a rise in the resistance after 1000 cycles of a temperature cycling test from −40 to 125° C. is 10 percent or less and a good result is obtained. Furthermore, after the electronic apparatus is left for 1000 hours in an environment in which the temperature is 121° C. and in which the humidity is 85%, the rate of a rise in the resistance is 10 percent or less and a good result is obtained. This is the same with the temperature cycling test. A section of the joining portion is observed by the use of an electron microscope. As a result, it is ascertained that a pole-like compound, which is $Ag_3Sn$, extending in a direction in which terminals of the circuit board and the semiconductor package are opposite to each other is formed between the terminals of the circuit board and the semiconductor package.

Example 5

A semiconductor package whose plane size is 35 mm×35 mm and a circuit board are joined by the use of a Sn-57Bi-1.0Ag (57 wt % of Bi and 1.0 wt % of Ag) solder ball. This joining is performed for 3 minutes in an atmosphere of nitrogen ($O_2$ concentration is 100 ppm or less) at temperature which is basically 139° C. and which does not exceed 210° C. At cooling time $N_2$ is selectively blown on the semiconductor package.

After it is ascertained that there is no problem about continuity of a joining portion of an electronic apparatus obtained by joining the circuit board and the semiconductor package in this way, the reliability of the joining portion is estimated. The rate of a rise in the resistance after 1000 cycles of a temperature cycling test from −40 to 125° C. is 10 percent or less and a good result is obtained. Furthermore, after the electronic apparatus is left for 1000 hours in an environment in which the temperature is 121° C. and in which the humidity is 85%, the rate of a rise in the resistance is 10 percent or less and a good result is obtained. This is the same with the temperature cycling test. A section of the joining portion is observed by the use of an electron microscope. As a result, it is ascertained that a pole-like compound, which is $Ag_3Sn$, extending in a direction in which terminals of the circuit board and the semiconductor package are opposite to each other is formed between the terminals of the circuit board and the semiconductor package.

According to the disclosed art, the strength of a joining portion between electronic parts is increased and an electronic apparatus including a joining portion with high reliability is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An electronic apparatus fabrication method comprising:
   preparing a first electronic part with a first terminal;
   preparing a second electronic part with a second terminal; and
   making the first terminal and the second terminal opposite to each other and joining the first terminal and the second terminal by the use of a joining material,
   the joining the first terminal and the second terminal by the use of the joining material including:
   heating and melting the joining material; and
   cooling and solidifying the joining material, wherein temperature of the first electronic part is made higher than temperature of the second electronic part during the cooling and solidifying.

2. The electronic apparatus fabrication method according to claim 1 further comprising disposing over the first electronic part a first member having first heat capacity after the preparing the first electronic part with the first terminal, wherein the joining the first terminal and the second terminal by the use of the joining material includes joining the first terminal of the first electronic part over which the first member is disposed and the second terminal of the second electronic part.

3. The electronic apparatus fabrication method according to claim 2 further comprising removing the first member after the joining the first terminal and the second terminal by the use of the joining material.

4. The electronic apparatus fabrication method according to claim 3, wherein:
   the disposing the first member over the first electronic part includes attaching the first member to the first electronic part by the use of an adhesive; and
   the removing the first member includes weakening adhesion of the adhesive and removing the first member from the first electronic part.

5. The electronic apparatus fabrication method according to claim 1, wherein the cooling and solidifying the joining material includes selectively cooling the second electronic part, of the first electronic part and the second electronic part, so as to make the temperature of the first electronic part higher than the temperature of the second electronic part.

6. The electronic apparatus fabrication method according to claim 1, wherein the cooling and solidifying the joining material includes selectively heating the first electronic part, of the first electronic part and the second electronic part, so as to make the temperature of the first electronic part higher than the temperature of the second electronic part.

* * * * *